(12) United States Patent
Nakao

(10) Patent No.: US 6,373,419 B1
(45) Date of Patent: Apr. 16, 2002

(54) DA CONVERTER AND LIQUID CRYSTAL DRIVING DEVICE INCORPORATING THE SAME

(75) Inventor: Tomoaki Nakao, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/461,810

(22) Filed: Dec. 16, 1999

(30) Foreign Application Priority Data

Dec. 16, 1998 (JP) .......................................... 10-357953

(51) Int. Cl.[7] ................................................ H03M 1/78
(52) U.S. Cl. .......................... 341/154; 345/98; 345/211
(58) Field of Search ................................. 341/154, 155; 340/728; 345/98, 211, 204

(56) References Cited

U.S. PATENT DOCUMENTS

| | | | | |
|---|---|---|---|---|
| 4,212,009 A | * | 7/1980 | Adleman et al. | ............ 340/728 |
| 5,926,162 A | * | 7/1999 | Wood et al. | ................. 345/101 |
| 5,982,349 A | * | 11/1999 | Yoon | ............................ 345/98 |
| 6,100,868 A | * | 8/2000 | Jeong et al. | ................... 345/98 |
| 6,188,395 B1 | * | 2/2001 | Yatabe | ........................ 345/211 |

* cited by examiner

Primary Examiner—Peguy Jeanpierre
Assistant Examiner—Joseph Lauture

(57) ABSTRACT

A standard voltage generating circuit produces $2^{(N-1)}+1$ mutually different standard voltages. A selector circuit stores standard voltage pairs so that each of the digital signals corresponds to one of the standard voltage pairs. No standard voltage pairs produce the same mean value. Upon reception of an input digital signal, the selector circuit selects one of the standard voltage pairs which corresponds to the input digital signal and provides the standard voltages of the selected pair for output. The standard voltages provided for output by the selector circuit are supplied to a voltage follower circuit which provides an output voltage having a mean value of the input standard voltages. In a DA converter and a liquid crystal driving device incorporating the DA converter, despite a possible increase in the number of voltages required for a display of more colors and more half-tones, large increases in the number of circuit arrangement elements can be avoided and increases in manufacturing cost can be restrained, allowing the device to be built in a more compact size.

23 Claims, 12 Drawing Sheets

DA CONVERTER AND LIQUID CRYSTAL DRIVING DEVICE INCORPORATING THE SAME

FIELD OF THE INVENTION

The present invention relates to a DA converter incorporated in liquid crystal driving and other devices, and further relates to a liquid crystal driving device incorporating such a DA converter.

BACKGROUND OF THE INVENTION

DA (digital-to-analogue) converter externally receives a digital signal and convert it to an analogue signal. For example, in a liquid crystal driving device of an active matrix liquid crystal display device, a DA converter is used to convert input signals, which constitute display data, from digital to analogue for an output to a liquid crystal display section. Some DA converters of this kind include an OP-amplifier composed of MOS transistors.

The following description will explain an arrangement of a liquid crystal display device incorporating the aforementioned DA converter, an arrangement of a TFT liquid crystal panel in that liquid crystal display device, a liquid crystal drive waveform of the liquid crystal panel, and an arrangement of a source driver provided to the liquid crystal display device, in reference to FIG. 7 through FIG. 11 which illustrate an arrangement in accordance with the present invention. In reference to FIG. 12 and FIG. 13, the following description will also explain a conventional arrangement of the aforementioned DA converter. Note in the following description that the present invention and the conventional technology share those common arrangements as presented in FIG. 7 through FIG. 11. The foregoing conventional arrangement is described in *CMOS Device Handbook*, edited by the Editing Committee for CMOS Device Handbook and published by The Nikkan Kogyo Shimbun Ltd. on Sep. 29, 1987.

FIG. 7 constitutes a block diagram showing an arrangement of a TFT (Thin Film Transistor) liquid crystal display device as a typical active matrix liquid crystal display device.

This liquid crystal display device is divided into two parts: a liquid crystal display section and a liquid crystal drive circuit (liquid crystal driving device) for driving the liquid crystal display section. The liquid crystal display section includes a TFT liquid crystal panel 901; the liquid crystal panel 901 includes therein liquid crystal display elements (not shown) and opposite electrodes (common electrodes) 906 (will be mentioned in detail later).

Meanwhile, the liquid crystal drive circuit includes source drivers 902 and gate drivers 902, each driver being built as an IC (Integrated Circuit), a controller 904, and a liquid crystal drive power supply 905. The controller 904 provides display data D and control signals SI to the inputs of the source drivers 902, and control signals S2 to the inputs of the gate drivers 903. Hence, the controller 904 provides vertical synchronized signals to the gate drivers 903 and horizontal synchronized signals to the source drivers 902 and the gate drivers 903.

The externally provided display data is transmitted through the controller 904 to the source drivers 902 as the display data D with its digital form being retained. The source driver 902 time-sequentially latches the incoming display data, and thereafter, converts the display data from digital to analogue in synchronization with the horizontal synchronized signals received from the controller 904. Then, the analogue voltages (half-tone display voltages) obtained from the DA conversion for half-tone display use are transmitted via liquid crystal drive voltage output terminals and source signal lines 1004 (will be mentioned in detail later) to the respective liquid crystal display elements (not shown) in the liquid crystal panel 901.

FIG. 8 shows an arrangement of the liquid crystal panel 901, including pixel electrodes 1001, pixel capacitors 1002, TFTs 1003 as elements for turning on/off voltage application to the pixels, source signal lines 1004, gate signal lines 1005, and opposite electrodes 1006 (equivalent to the opposite electrodes 906 in FIG. 7). In FIG. 8, the encircled area 'A' represents a liquid crystal display element for one pixel. The source drivers 902 couple half-tone display voltages to the source signal lines 1004 according to brightness of the pixels used for a display. The gate drivers 903 couple scan signals to the gate signal lines 1005 so as to sequentially turn on the vertically lined TFTs 1003. Through the TFT 1003 which is in an On state, the voltage in the source signal line 1004 is applied to the pixel electrode 1001 connected to the drain of that TFT 1003, causing accumulation of charges in the pixel capacitor 1002 formed between the pixel electrode 1001 and the opposite electrode 1006. The accumulation of charges alters the optical transmittance of the liquid crystal and realizes a display.

FIG. 9 and FIG. 10 show liquid crystal drive waveforms as examples. 1101 and 1201 each denote a drive waveform of the source driver 902. 1102 and 1202 each denote a drive waveform of the gate driver 903. 1103 and 1203 each denote a potential of the opposite electrode. 1104 and 1204 each denote a voltage waveform of the pixel electrode. The voltage applied across the liquid crystal material is equivalent to the potential difference between the pixel electrode 1001 and the opposite electrode 1006, which is shown as shaded areas in FIG. 9 and FIG. 10. For example, in FIG. 9, the TFT 1003 is turned on when the drive waveform 1102 of the gate driver is in high level, causing the difference between the drive waveform 1101 of the source driver and the potential of the opposite electrode 1103 to be applied to the pixel electrode 1001. Subsequently, the drive waveform 1102 of the gate driver changes to low level, causing the TFT 1003 to change to an Off state. Here, the aforementioned voltage is retained across the pixel due to the presence of the pixel capacitor 1002. The same explanation holds true with the case in FIG. 10. FIG. 9 and FIG. 10 show different voltages being applied across the liquid crystal material: a higher voltage is applied in the case shown in FIG. 9 than in the case shown in FIG. 10. In this manner, a multiple half-tone display is achieved by applying variable analogue voltage across the liquid crystal and thus altering the optical transmittance of the liquid crystal in an analogue manner. The number of analogue voltages available for application across the liquid crystal determines the number of half-tones displayed.

FIG. 11 shows a block diagram of the source driver 902 as an example. Display data, provided externally as digital signals, consist of display data, DR, DG, and DB for R (red), G (green), and B (blue); the display data is temporarily latched by an input latch circuit 1301, and thereafter stored time-sequentially in a sampling memory 1303 based on the operation of a shift register 1302 which receives a start pulse SP and shifts with a clock CK; the whole data is then simultaneously transferred to a hold memory 1304 in accordance with a horizontal synchronized signal (not shown). "S" represents cascade outputs. A standard voltage generating circuit 1309 generates standard voltages of differing levels according to a reference voltage VR. The hold memory 1304 transmits the data through a level shifter circuit 1305 to a DA converter circuit (digital to analogue converter circuit) 1306 where the data is converted to analogue voltages based on the standard voltages of differing levels provided by the standard voltage generating circuit 1309. Then, an output circuit 1307 provides outputs as half-tone display voltages that are transmitted through liquid crystal drive voltage output terminals 1308 to liquid crystal display elements (see "A" in FIG. 8).

In this manner, the standard voltage generating circuit 1309, the DA converter circuit 1306, and the output circuit 1307 constitute a DA converter. Further, in the liquid crystal display device, a liquid crystal drive circuit is arranged using the DA converter in the aforementioned manner, and as mentioned above, the DA converter converts digital data (display data DR, DG, DB) from digital to analogue for a display on the liquid crystal panel 901 and applies the converted analogue data to liquid crystal display elements.

FIG. 12 and FIG. 13 show an arrangement into details of a DA converter used in a liquid crystal drive circuit identical to the one above to convert display data from digital signals to analogue voltages for outputs. The DA converter is arranged from a standard voltage generating circuit 1401 (equivalent to the standard voltage generating circuit 1309 in FIG. 11), a selector circuit 1402 (equivalent to the DA converter circuit 1306 in FIG. 11), and voltage follower circuit 1403 (equivalent to the output circuit 1307 in FIG. 11). FIGS. 12 and 13 shows, as an example, the arrangement of a DA converter used for a 64 half-tone liquid crystal drive circuit that provides 64 analogue voltage outputs corresponding to the 6-bit digital signals (Bit5 to Bit0). FIG. 13 is an enlarged view of "A" encircling $V_{48}$ to $V_{64}$ of the standard voltage generating circuit 1401 and the selector circuit 1402 shown in FIG. 12. The circuits in FIG. 12 are arranged by repeating the arrangement pattern shown in FIG. 13.

The standard voltage generating circuit 1401 generates a plurality of standard voltages (64 different voltages in this example) according to the display data provided as digital signals. The selector circuit 1402, arranged from MOS transistor switches, selects one of those standard voltages for output. The arrangement of the switches will be explained later in detail. The voltage follower circuit 1403 provides the voltage selected by the selector circuit 1402 as an output liquid crystal drive signal through a liquid crystal drive voltage output terminal (equivalent to the liquid crystal drive voltage output terminal 1308 in FIG. 11) to a liquid crystal display element.

Normally, a standard voltage generating circuit 1401 is commonly used for a plurality of liquid crystal drive voltage output terminals.

Meanwhile, a selector circuit 1402 and a voltage follower circuit 1403 are provided for each liquid crystal drive voltage output terminal. In the event of a color display, a liquid crystal drive voltage output terminal is used corresponding to each color; in such an event, a selector circuit 1402 and a voltage follower circuit 1403 are provided for each color in a pixel. Accordingly, supposing that the liquid crystal panel 901 includes the total of N pixels, the liquid crystal panel 901 has liquid crystal drive voltage output terminals $R_1, G_1, B_1, R_2, G_2, B_2, \ldots, R_N, G_N,$ and $B_N$, which requires 3N selector circuits 1402 and voltage follower circuits 1403, where R, G, B denote liquid crystal drive voltage output terminals for red, green, and blue respectively and the subscripted n (n=1, 2, . . . , N) denotes the pixels.

The following description will explain the arrangement and operation of a DA converter used for this liquid crystal drive circuit.

The standard voltage generating circuit 1401 includes an arrangement where 64 resistor elements are connected in series, and receives a largest liquid crystal drive voltage $V_{64}$ and a smallest liquid crystal drive voltage $V_0$ at terminals located at the respective ends. Therefore, 64 voltages ($V_0$ to $V_{63}$) are available at respective resistor elements, in proportion to the resistance of the resistor elements. Those 64 different voltages generated by the standard voltage generating circuit 1401 are provided for input to the selector circuit 1402.

In the selector circuit 1402, MOS transistor switches are configured to select one of the 64 input voltages for output according to the display data composed of 6-bit digital signals. Specifically, the switches are turned on/off according to each piece of display data composed of 6-bit digital signals (Bit0 to Bit5). Hence, one of the 64 input voltages is selected for output. The following description will explain voltage selection procedures in detail.

In the 6-bit digital signals, Bit5 is MSB, and Bit0 is LSB. The switches are paired in two to form switch pairs. Bit0 is provided with 32 switch pairs (64 switches), while Bit1 is provided with 16 switch pairs (32 switches). As moving up from a certain bit to a next bit, the number of switch pairs decreases by half, down to a single switch pair (two switches) for Bit5. So, the total number of the switch pairs amounts to $1+2+2^2+2^3+2^4 2^5=63$ (126 switches).

The two switches composing a switch pair operate so that if the corresponding bit is "0" the upper switch (as can be seen in FIG. 12) turns off, and the lower switch turns on. In contrast, if the corresponding bit is "1", the upper switch (as can be seen in FIG. 12) turns on, and the lower switch turns off. For example, referring to the example shown in FIG. 12, (Bit5, Bit4, . . . , Bit0) is "111111", all the upper switches are on and all the lower switches are off, allowing an output voltage $V_{63}$ to appear at the output terminal of the selector circuit 1401. Further, for example, if (Bit5, Bit4, . . . , Bit0) is "000001", an output voltage V, appears at an output terminal of the selector circuit 1401. The voltage follower circuit 1403 provides a voltage that is identical to the analogue voltage transmitted from the selector circuit 1402, for output via the liquid crystal drive voltage output terminal as a liquid crystal drive signal having a smaller internal resistance.

If the conventional DA converter is used for a liquid crystal driving device of a liquid crystal display device, the number of elements composing the circuit increases sharply as a larger number of half-tones are to be displayed. Taking a 64 half-tone display as an example, 64 resistor elements are required in a standard voltage generating circuit 1401. Plus, 126 switches are required for every pixel to form a selector circuit 1402. In the same manner, when a 256 half-tone display is performed using 8-bit digital signals, 256 resistor elements are required in a standard voltage generating circuit 1401, and 510 switches are required for every pixel to form a selector circuit 1402 that includes $1+2+2^2+2^3+ \ldots +2^7=255$ switch pairs.

Further, if a color display is to be performed in the manner mentioned above, since there are three colors included (red, green, and blue), the number of switches required triples.

In this manner, the liquid crystal driving device in accordance with conventional technology requires an increasingly large number of circuit elements to display more colors and half-tones; as a result, the liquid crystal driving device, when fabricated as an integrated circuit, inevitably has a larger chip size.

There is a trend in recent years for the liquid crystal display device to include more minute structures and display more half-tones, resulting in increases in the size of circuits in the liquid crystal driving device. Meanwhile, as the liquid crystal display device finds applications in more fields, there are in the market increasingly higher demands for cheaper liquid crystal display devices and stronger needs to reduce manufacturing costs by manufacturing smaller liquid crystal driving devices.

However, as mentioned above, conventional technology requires greatly larger number of circuit arrangement elements to realize more minute structures and half-tones, which adds to the cost of manufacturing.

In another aspect, there are strong demands for smaller liquid crystal driving devices in liquid crystal display devices, to enhance portability, which adds the importance of reduction in the size of the liquid crystal driving device.

However, since as mentioned above, conventional technology requires greatly larger number of circuit arrangement elements for more minute structures and half-tones, the chip size grows when the liquid crystal driving device is fabricated as an integrated circuit, which renders it difficult to reduce the size.

SUMMARY OF THE INVENTION

The present invention has an object to offer a DA converter that, despite a possible increase in the number of voltages required, restrains large increases in the number of circuit arrangement elements (resistor elements, switches, etc.) and hence restrains increases in manufacturing cost, and that can be built in a more compact size.

The present invention has another object to offer a liquid crystal driving device that, despite a display of more colors and half-tones, restrains large increases in the number of circuit arrangement elements and hence restrains increases in manufacturing cost, and that can be built in a more compact size.

In order to achieve the object, a DA converter in accordance with the present invention is for converting N-bit digital signals to analogue signals by generating mutually different standard voltages and providing $2^N$ output voltages based on the standard voltages according to the digital signals, and is characterized in that the DA converter includes:
  a standard voltage generating circuit for generating $2^{(N-1)}+1$ mutually different standard voltages,
  selector circuit for: storing standard voltage pairs in advance so that none of the standard voltage pairs produces an identical mean value and also that each of the digital signals corresponds to one of the standard voltage pairs; upon reception of one of the digital signals, selecting one of the standard voltage pairs corresponding to the received digital signal; and providing the standard voltages constituting the selected standard voltage pair for output; and
  an output circuit for receiving the output standard voltages of the selector circuit, and providing as an output voltage a mean value of the received standard voltages.

The DA converter converts digital signals to analogue signals by, for example, generating mutually different standard voltages through division by means of resistor elements and turning on/off switches according to N-bit digital signals to provide an $2^N$ output voltages based on the standard voltages.

In such an arrangement, the standard voltage generating circuit generates $2^{(N-1)}+1$ different standard voltages. The selector circuit stores in advance standard voltage pairs so that each of the digital signals has a corresponding standard voltage pair. Here, no standard voltage pairs produce the same mean value. Upon reception of an input digital signal, the selector circuit selects one of the standard voltage pairs which corresponds to the input digital signal by, for example, turning on/off switches according to the digital signal and provides the standard voltages constituting the selected pair for output. The standard voltages provided for output by the selector circuit are supplied to an output circuit which provides an output voltage having a mean value of the input standard voltages.

In this manner, the voltages generated by the standard voltage generating circuit are subjected to predetermined calculations to generate voltages that are not generated by the standard voltage generating circuit. As a result, those voltages that are not generated by the standard voltage generating circuit become available for output, as well as the voltages generated by the standard voltage generating circuit.

In this manner, the standard voltage generating circuit may generate less voltages than actually required; therefore, the number of elements, for example, resistor elements, in the standard voltage generating circuit can be greatly reduced in comparison with conventional technology. Further, since the number of voltages generated by the standard voltage generating circuit is relatively small, the number of elements, for example, switches for turning on/off, in the selector circuit for selecting some of those voltages can be greatly reduced in comparison with conventional technology. Consequently, despite a possible increase in the number of voltages required, large increases in the number of circuit arrangement elements (resistor elements, switches, etc.) can be avoided and increases in manufacturing cost can be restrained, allowing the device to be built in a more compact size.

Further, in order to achieve the object, a liquid crystal driving device in accordance with the present invention is for converting display data from digital to analogue for output via a liquid crystal driving voltage output terminal to apply the DA converted data to a liquid crystal display element, and is characterized in that the DA conversion is done using a DA converter arranged in the above manner.

In this arrangement, output voltages are provided in a similar manner to the earlier arrangement. Therefore, similarly to the earlier arrangement, despite a possible increase in the number of voltages required in an attempt to display more colors and half-tones, the standard voltage generating circuit may generate less voltages than actually required; therefore, the number of elements, for example, resistor elements, in the standard voltage generating circuit can be greatly reduced in comparison with conventional technology. Moreover, similarly to the earlier arrangement, since the number of voltages generated by the standard voltage generating circuit is relatively small, the number of elements, for example, switches, in the selector circuit for selecting some of those voltages can be greatly reduced in comparison with conventional technology, which allows a great reduction in the size of the circuit in comparison with conventional technology. Consequently, the DA conversion using such a DA converter restrains large increases in the number of circuit arrangement elements in an attempt to display more colors and half-tones, thus restrains increases in manufacturing cost, and allows the device to be built in a more compact size.

Especially, a reduction in the size of the selector circuit is possible with every single liquid crystal drive voltage output terminal; accordingly, the use of smaller liquid crystal drive voltage output terminals amounts to great reductions in the circuit size when the entire liquid crystal display device is taken into account, enabling great reductions in chip size and manufacturing cost of the liquid crystal driving device when it is fabricated as an integrated circuit.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Referring to FIG. 1 through FIG. 11, the following description will explain an embodiment in accordance with the present invention. A DA converter of the present embodiment is provided with an OP-amplifier arranged from MOS transistors, and can be used especially for a liquid crystal drive circuit (liquid crystal driving device) in an active matrix liquid crystal display device, as well as other purposes.

The arrangement of the liquid crystal display device including the DA converter, the arrangement of the liquid crystal panel in that liquid crystal display device, the liquid crystal drive waveform thereof, and the arrangement of the source driver provided in the liquid crystal display device are identical to those explained above in reference to conventional technology as illustrated in FIG. 7 through FIG. 11; explanation thereof is therefore omitted here.

Figure 1:
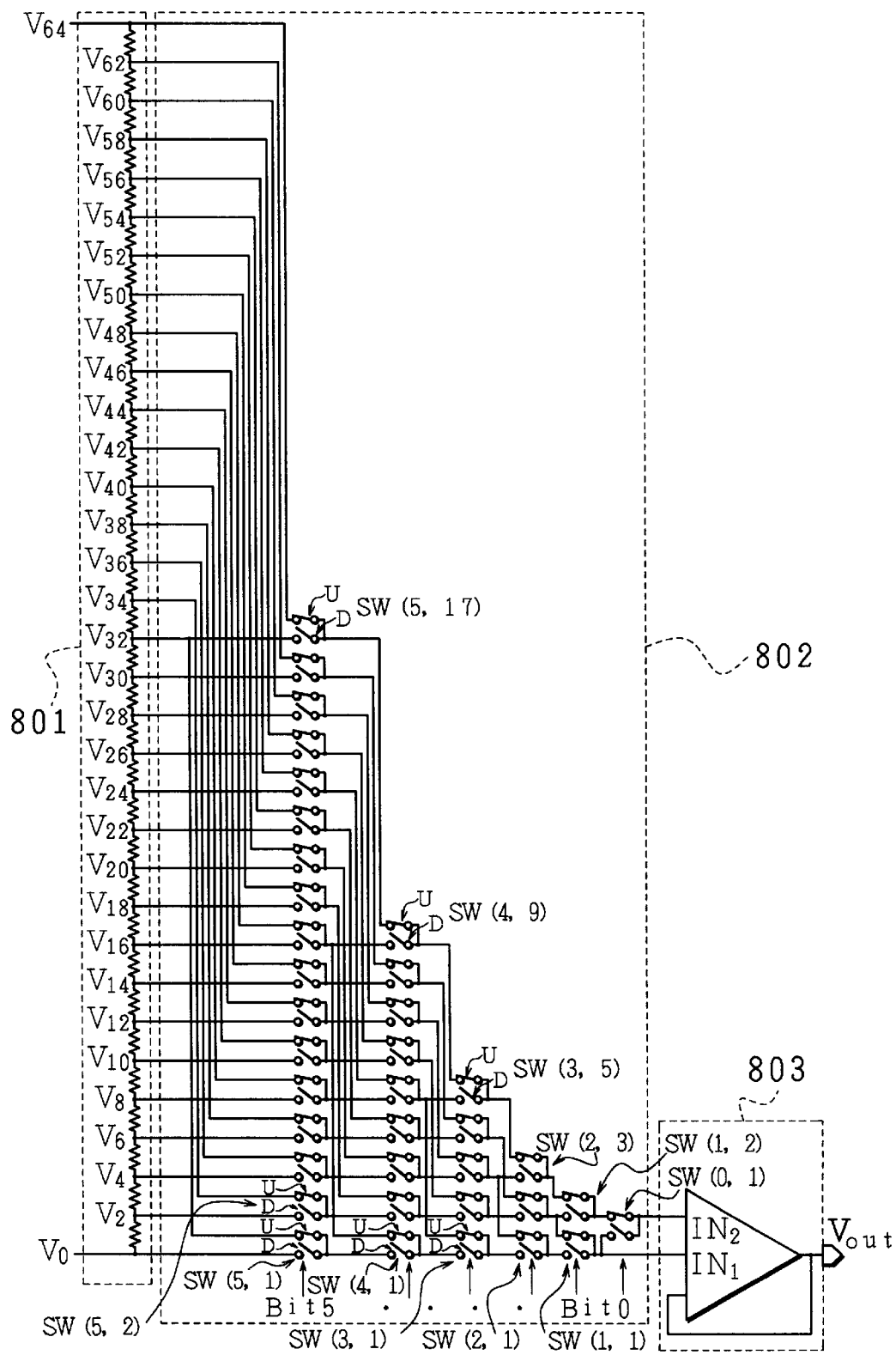
FIG. 1 is a circuit diagram showing, as an example, an arrangement of a DA converter in accordance with the present invention

Referring to FIG. 1, the arrangement of a standard voltage generating circuit 801, a selector circuit 802, and a voltage follower circuit 803 will be explained.

FIG. 1 is a circuit diagram showing an arrangement of a DA converter of the present embodiment. The DA converter includes a standard voltage generating circuit (standard voltage generating means) 801, a selector circuit (selector means) 802 as a DA converter circuit, and a voltage follower circuit (output means) 803 as an output circuit. Besides these circuits, the DA converter may also includes a circuit (not shown) for adjusting brightness of a liquid crystal display.

Here, an example will be explained where 64 analogue voltages are produced for output from 6-bit display data as required for a 64 half-tone display. In the display data, Bit5 is MSB, and Bit0 is LSB.

As shown in FIG. 1, there is provided a standard voltage generating circuit 801 that is a resistance type potential divider circuit. Specifically, the standard voltage generating circuit 801 is a resistance type potential divider circuit where a plurality of resistor elements are coupled to each other to generate standard voltages which can be derived at connecting portions between the resistor element. The standard voltage generating circuit 801 is arranged from 32 resistor elements connected in series, and receives an input of a maximum liquid crystal drive voltage ($v_{64}$) at one of the terminals and another input of a minimum voltage ($V_0$) at the other terminal. This arrangement enables 33 voltages ($V_0$, $V_2$, $V_4$, $V_6$, ..., $V_{62}$, $V_{64}$) to be generated and derived at terminals of the resistors in proportion to the resistance values of the resistor elements. The 33 voltages correspond to those liquid crystal drive voltages that create every two half-tones.

The selector circuit 802 will be explained with respect to its circuit arrangement and input/output relationship.

As shown in FIG. 1, there is provided a selector circuit 802 that has two output terminals. The selector circuit 802 selects a suitable voltage or two for an output from externally provided 33 voltages according to a 6-bit digital display signal. The selector circuit 802 is arranged from MOS transistor switches for example. The switch may be arranged from an analogue switch such as an MOS transistor or a transmission gate. The switches are paired in two to form switch pairs to select one of two input signals for output according to 6-bit display data.

In FIG. 1, the switch pair is denoted as SW(X, Y) where X is an integral number 0, 1, 2, ..., representing horizontal positions in FIG. 1 starting on the right-hand side and moving leftward, and coincides with a digit in the bits, Y is 1, 2, ..., representing vertical positions in FIG. 1 starting at the bottom and moving upward. Further, to distinguish one of the switches from the other in a switch pair, the upper switch in FIG. 1 has a suffix U and the lower switch in FIG. 1 has a suffix D. For example, the switch pair located 4th from the right and 2nd from the bottom is denoted as SW(3,2); the upper switch, forming a half of the switch pair, is denoted as SW(3,2)U and the lower switch, forming the other half, is denoted as SW(3,2)D.

The switch pairs in a predetermined column are denoted collectively without the second numeral; for example, the switch pairs in the 4th column from the right, i.e., SW(3,1), SW(3,2), ..., etc., are denoted collectively as SW(3). The upper switches of all the switch pairs in a predetermined column are denoted collectively without the second numeral; for example, the upper switch of the 4th switch pair from the right, i.e., SW(3,1)U, SW(3,2)U, ..., etc., are denoted collectively as SW(3)U. The same nomenclature applies to the lower switches.

The configuration of switches for each bit will be explained.

For 6-bit display data, 17 switch pairs, SW(5,1) to SW(5,17), operate in accordance with Bit5 (MSB), each pair including two switches, i.e., an upper switch and a lower switch.

$V_0$ is supplied to one of the terminals of SW(5,1)D, and $V_{32}$ is supplied to one of the terminals of SW(5,1)U; the other terminals of SW(5,1)D and SW(5,1)U are coupled to each other to form a common terminal. $V_2$ is supplied to one of the terminals of SW(5,2)D, and $V_{34}$ is supplied to one of the terminals of SW(5,2)U; the other terminals of SW(5,2)D and SW(5,2)U are coupled to each other to form a common terminal. Similarly, $V_{2(n-1)}$ is supplied to one of the terminals of SW(5,n)D, and $V_{2(n-1)+32}$ is supplied to one of the terminals of SW(5,n)U; the other terminals of SW(5,n)D and SW(5,n)U are coupled to each other to form a common terminal, where n=1, 2, . . . , and 17.

These switch pairs SW(5) operate interactively; when Bit5 is "0", the lower switches SW(5)D are closed (turned on), and conversely, the upper switches SW(5)U are opened (turned off). Meanwhile, when Bit5 is "1", the lower switches SW(5)D are opened (turned off), and conversely, the upper switches SW(5)U are closed (turned on).

Similarly to the above case, nine switch pairs, SW(4,1) to SW(4,9), operate in accordance with Bit4, each pair including two switches, i.e., an upper switch and a lower switch.

The common terminal of SW(5,1) is coupled to one of terminals of SW(4,1)D, and the common terminal of SW(5,9) is coupled to one of the terminals of SW(4,1)U; the other terminals of SW(4,1)D and SW(4,1)U are coupled to each other to form a common terminal. Similarly, the common terminal of SW(5,m) is coupled to one of the terminals of of SW(4,m)D, and the common terminal of SW(5,m+8) is coupled to one of the terminals of SW(4,m)U; the other terminals of SW(4,m)D and SW(4m)U are coupled to each other to form a common terminal, where m=1, 2, . . . , and 9.

These switch pairs SW(4) operate interactively; when Bit4 is "0", the lower switches SW(4)D are closed (turned on), and conversely, the upper switches SW(4)U are opened (turned off). Meanwhile, when Bit4 is "1", the lower switches SW(4)D,are opened (turned off), and conversely, the upper switches SW(4)U are closed (turned on).

Similarly to the above cases, five switch pairs, SW(3,1) to SW(3,5), operate in accordance with Bit3, each pair including two switches, i.e., an upper switch and a lower switch.

The common terminal of SW(4,1) is coupled to one of the terminals of SW(3,1)D, the common terminal of SW(4,5) is coupled to one of the terminals of SW(3,1)U; the other terminals of SW(3,1)D and SW(3,1)U are coupled with each other to form a common terminal. Similarly, the common terminal of SW(4,k) is coupled to one of the terminals of SW(3,k)D, and the common terminal of SW(4,k+4) to the one of the terminals of SW(3,k)U; the other terminals of SW(3,k) and SW(3,k)U are coupled with each other to form a common terminal, where k=1, 2, . . . , and 5.

These switch pairs SW(3) operate interactively; when Bit3 is "0", the lower switches SW(3)D are closed (turned on), conversely the upper switches SW(3)U are opened (turned off). Meanwhile, when Bit3 is "1", the lower switches SW(3)D are opened (turned off), and conversely the upper switches SW(3)U are closed (turned on).

Similarly, three switch pairs, SW(2,1) to SW(2,3), operates in accordance with Bit2, each pair including two switches, i.e., an upper switch and a lower switch.

The common terminal of SW(3,1) is coupled to one of the terminals of SW(2,1)D, and the common terminal of SW(3, 3) is coupled to one of the terminals of SW(2,1)U; the other terminals of SW(2,1)D and SW(2,1)U are coupled with each other to form a common terminal. Similarly, the common terminal of SW(3,j) is coupled to one of the terminals of SW(2,j)D, and the common terminal of SW(3,j+2) is coupled to one of the terminals of SW(2,j)U; the other terminals of SW(2,j)D and SW(2,j)U are coupled to each other to form a common terminal, where j=1, 2, and 3.

These switch pairs SW(2) operate interactively; when Bit2 is "0", the lower switches SW(2)D are closed (turned on), and conversely, the upper switches SW(2)U are opened (turned off). Meanwhile, when Bit2 is "1", the lower switches SW(2)D are opened (turned off), and conversely, the upper switches SW(2)U are closed (turned on).

Similarly, two switch pairs, SW(1,1) and SW(1,2), operate in accordance with Bit1, each pair including two switches, i.e., an upper switch and a lower switch.

The common terminal of SW(2,1) is coupled to one of the terminals of SW(1,1)D, and the common terminal of SW(2, 2) is coupled to one of the terminals of SW(1,1)U; the other terminals of SW(1,1)D and SW(1,1)U are coupled to each other to form a common terminal.

The common terminal of SW(2,2) is coupled to one of the terminals of SW(1,2)D, and the common terminal of SW(2, 3) is coupled to one of the terminals of SW(1,2)U; the other terminals of SW(1,2)D and SW(1,2)U are coupled to each other to form a common terminal.

In other words, the common terminal of SW(2,h) is coupled to one of the terminals of SW(1,h)D, and the common terminal of SW(2,h+1) is coupled to one of the terminals of SW(1,h)U; the other terminals of SW(1,h)D and SW(1,h)U are coupled to each other to form a common terminal, where h=1 and 2.

These switch pairs SW(1) operate interactively; when Bit1 is "0", the lower switches SW(1)D are closed (turned on), and conversely, the upper switches SW(1)U are opened (turned off). Meanwhile, when Bit1 is "1", the lower switches SW(1)D are opened (turned off), and conversely, the upper switches SW(1)U are closed (turned on).

Finally, similarly to the above cases, one switch pair, SW(0,1), operates in accordance with Bit0, the pair including two switches, i.e., an upper switch and a lower switch.

The common terminal of SW(1,1) is coupled to one of the terminals of SW(0,1)D, and the common terminal of SW(1, 2) is coupled to one of the terminals of SW(0,1)U; the other terminals of SW(0,1)D and SW(0,1)U are coupled to each other to form a common terminal, and the common terminals is in turn coupled to an input terminal $IN_2$ of the voltage follower circuit 803.

The common terminal of SW(1,1) is coupled to an input terminal $IN_1$ of the voltage follower circuit 803, as well as to one of the terminals of SW(0,1)D as described earlier.

As to this switch pairs SW(0), when Bit1 is "0", the lower switches SW(0)D are closed (turned on), and conversely, the upper switches SW(0)U are opened (turned off). Meanwhile, when Bit1 is "1", the lower switches SW(0)D are opened (turned off), and conversely, the upper switches SW(0)U are closed (turned on).

The foregoing described the circuit arrangement and operations of the selector circuit 802. To sum up those operations, Table 1 shows a relationship among the 6-bit display data, the output (input voltage supplied to $IN_1$ and $IN_2$) of the selector circuit 802, and the output voltage $V_{out}$ (detailed later) of the voltage follower. circuit 803.

TABLE 1

| Bit | | | | | | | | |
|---|---|---|---|---|---|---|---|---|
| 5 | 4 | 3 | 2 | 1 | 0 | IN$_1$ | IN$_2$ | V$_{out}$ |
| 0 | 0 | 0 | 0 | 0 | 0 | V$_0$ | V$_0$ | V$_0$ |
| 0 | 0 | 0 | 0 | 0 | 1 | V$_0$ | V$_2$ | V$_1$ |
| 0 | 0 | 0 | 0 | 1 | 0 | V$_2$ | V$_2$ | V$_2$ |
| 0 | 0 | 0 | 0 | 1 | 1 | V$_2$ | V$_4$ | V$_3$ |
| 0 | 0 | 0 | 1 | 0 | 0 | V$_4$ | V$_4$ | V$_4$ |
| ... | ... | ... | ... | ... | ... | ... | ... | ... |
| 1 | 1 | 1 | 0 | 1 | 1 | V$_{58}$ | V$_{60}$ | V$_{59}$ |
| 1 | 1 | 1 | 1 | 0 | 0 | V$_{60}$ | V$_{60}$ | V$_{60}$ |
| 1 | 1 | 1 | 1 | 0 | 1 | V$_{60}$ | V$_{62}$ | V$_{61}$ |
| 1 | 1 | 1 | 1 | 1 | 0 | V$_{62}$ | V$_{62}$ | V$_{62}$ |
| 1 | 1 | 1 | 1 | 1 | 1 | V$_{62}$ | V$_{64}$ | V$_{63}$ |

As shown in Table 1, if the 6-bit display data is an number (if Bit0 is "0"), a voltage is selected from 32 voltages, V$_0$ to V$_{62}$; therefore voltages of an identical value are coupled to the input terminals IN$_1$ and IN$_2$ of the voltage follower circuit 803.

Meanwhile, if the 6-bit display data is an odd number (if Bit0 is "1"), two voltages are selected from 32 voltages, V$_0$ to V$_{62}$; therefore V$_{2(n-1)}$ is coupled to the input terminal IN$_1$ of the voltage follower circuit 803 and V$_{2n}$ is coupled to the input terminal IN$_2$ of the voltage lower circuit 803.

Next, the voltage follower circuit 803 will be explained.

As shown in Table 1, the voltage follower circuit 803 receives input voltages via the two input terminals (IN$_1$ and IN$_2$) and provides an output voltage V$_{out}$ that satisfies the following relationship. Here, the input voltages provided via the input terminals IN$_1$ and IN$_2$ will be denoted as V$_{IN1}$ and V$_{IN2}$ respectively. Also, the voltages produced by the standard voltage generating circuit 801 will be denoted V$_i$ collectively, where i=0, 2, 4, ..., and 2(n−1): specifically, in the present embodiment, n=33, and therefore, the voltages are V$_0$, V$_2$, V$_4$, ..., and V$_{64}$.

If voltages of an identical value are supplied to the input terminals IN$_1$ and IN$_2$, that is, if V$_{IN1}$=V$_{IN2}$=V$_i$, the voltage follower circuit 803 provides this V$_i$ as the output voltage V$_{out}$.

In contrast, voltages of different values are supplied to the input terminals IN$_1$ and IN$_2$, that is, if V$_{IN1}$=V$_i$, V$_{IN2}$=V$_{i+2}$, the voltage follower circuit 803 provides (V$_i$+V$_{i+2}$)/2 as the output voltage V$_{out}$.

Figure 2:
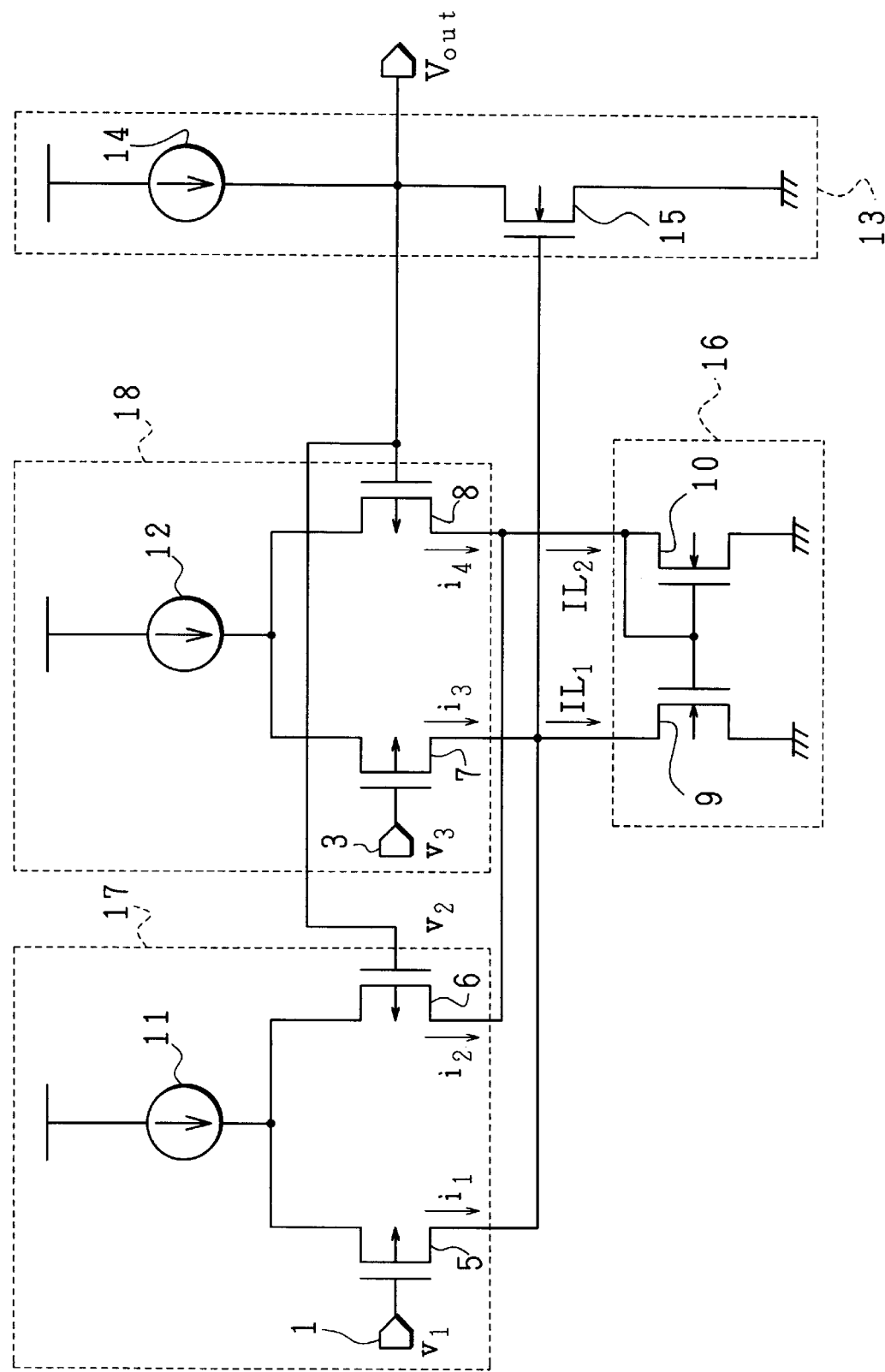
FIG. 2 is a circuit diagram showing, as an example, a voltage follower circuit in the DA converter shown in FIG. 1.

FIG. 2 shows, as an example, such a voltage follower circuit 803 that provides the output voltages above. FIG. 2 is a circuit diagram illustrating details of the voltage follower circuit 803. As shown in FIG. 2, there are provided P channel MOS transistors 5, 6, 7 and 8. The P channel MOS transistors 5 and 6 form a differential pair. Similarly, the P channel MOS transistor2 7 and 8 form a differential pair.

The P channel MOS transistors 5 and 6 are coupled to each other at their sources, and further to a power supply (not shown) via a constant current source 11. Meanwhile, the P channel MOS transistors 7 and 8 are coupled to each other at their sources, and further to a power supply (not shown) via a constant current source 12. The constant current sources 11 and 12 supply operation current to transistors forming the differential pairs. The P channel MOS transistor 5 has an in-phase input terminal 1. Similarly, the P channel MOS transistor 7 has an in-phase input terminal 3. The P channel MOS transistors 5 and 7 are coupled to each other at a common anti-phase input terminal (see 2 and 4 in FIG. 3).

The P channel MOS transistors 5 and 6, the in-phase input terminal 1, the anti-phase input terminal 2 (see FIG. 3), and the constant current source 11 constitute a differential amplifier circuit 17. Similarly, the P channel MOS transistors 7 and 8, the in-phase input terminal 3, the anti-phase input terminal 4 (see FIG. 3), and the constant current source 12 constitute a differential amplifier circuit 18.

The P channel MOS transistors 5 and 7 are coupled to each other at their drains and further to the drain of an N channel MOS transistor 9 provided in a load circuit (load element) 16 as a positive load circuit (positive load element) that constitutes a current mirror circuit. Meanwhile, the P channel MOS transistors 6 and 8 are coupled to each other at their drains and further to the drain of an N channel MOS transistor 10 that is provided in the load circuit 16 to constitute a current mirror circuit and to have a diode connection. The sources of the N channel MOS transistors 9 and 10 are grounded.

There is also provided an output section 13, composed of an N channel MOS transistor 15 and a constant current source 14 that supplies operation current to the N channel MOS transistor 15. The drain of the N channel MOS transistor 15 is coupled to a power supply (not shown) via the constant current source 14, while the source of the N channel MOS transistor 15 is grounded. The gate of the P channel MOS transistor 6, the gate of the P channel MOS transistor 8, and the drain of the N channel MOS transistor 15 are coupled to each other to form an output terminal to supply the output voltage V$_{out}$. The gate of the N channel MOS transistor 15 is coupled to the drain of the N channel MOS transistor 9. Currents of an identical value flow from the constant current sources 11 and 12, which will be denoted as Is.

Further, the P channel MOS transistors 5, 6, 7 and 8, which form differential pairs, share an identical transmission conductance gm and other similar properties.

Figure 3:
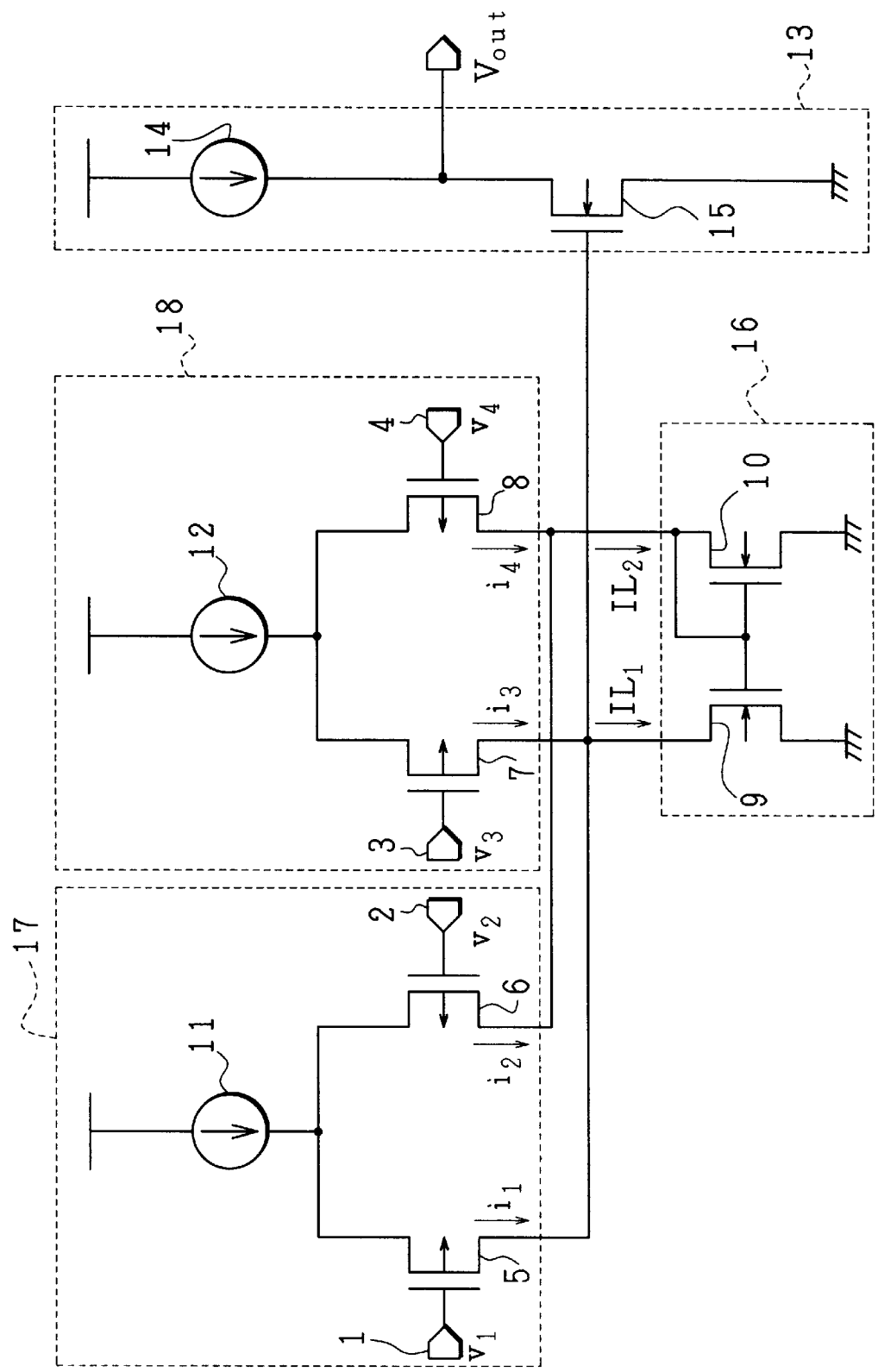
FIG. 3 is a circuit diagram illustrating an operation of the voltage follower circuit shown in FIG. 2.

Here, for convenience in the explanation of the operation, in the arrangement of the voltage follower circuit 803 shown in FIG. 2, it is presumed, as shown in FIG. 3, that the gate of the P channel MOS transistor 6, the gate of the P channel MOS transistor 8, and the drain of the N channel MOS transistor 15 are disconnected to form an OP-amplifier circuit.

When input voltages v$_1$ and v$_2$ are supplied to the in-phase input terminal 1 and the anti-phase input terminal 2 respectively, the drain current i$_1$ of the P channel MOS transistor 5 and the drain current i$_2$ of the P channel MOS. transistor 6 are given by the equations:

$$i_1=(I/2)+gm(v_2-v_1)=(I/2)+gm\cdot\Delta v_a \quad (1)$$

$$i_2=(I/2)-gm(v_2-v_1)=(I/2)-gm\cdot\Delta v_a \quad (2)$$

where $\Delta v_a$=v$_{2-v1}$.

Similarly, when input voltages v$_3$ and V$_4$ are supplied to the in-phase input terminal 3 and the anti-phase input terminal 4 respectively, the drain current i$_3$ of the P channel MOS transistor 7 and the drain current i$_4$ of the P channel MOS transistor 8 are given by the equations:

$$i_3=(I/2)+gm(v_4-v_3)=(I/2)+gm\cdot\Delta v_b \quad (3)$$

$$i_4=(I/2)-gm(v_4-v_3)=(I/2)-gm\cdot\Delta v_b \quad (4)$$

where $\Delta v_b$=v$_4$−v$_3$.

Considering these equations, the drain current IL$_1$ of the N channel MOS transistor 9 as a load current and the drain current IL$_2$ of the N channel MOS transistor 10 also as a load current are given by the equations:

$$IL_1=i_1+i_3=I+gm(\Delta v_a+\Delta v_b) \quad (5)$$

$$IL_2=i_2+i_4=I-gm(\Delta v_a+\Delta v_b) \quad (6)$$

From these equations (5) and (6), it is understood that IL$_1$ and IL$_2$ are the sums of results of the differential amplification of the two differential pairs.

Since the N channel MOS transistor 9 and the N channel MOS transistor 10 constitute a current mirror circuit as mentioned earlier, two drain currents $IL_1$ and $IL_2$ as load currents are equal to each other in an operation range where the output section 13 of the OP-amplifier performs a normal amplifying operation. Since $IL_1=IL_2$, the following equation is obtained from equations (5) and (6):

$$\Delta v_a + \Delta v_b = 0$$

The equation can be rewritten as equation (7):

$$(v_2-v_1)+(v_4-v_3)=0 \qquad (7)$$

The equation gives a result of an application of an imaginary short relationship of a normal OP-amplifier circuit to a circuit of the present embodiment. The relationship is based on the assumption that the differential amplifier circuits 17 and 18 shown in FIG. 3 are specified in advance to operate in a state where a proper bias is given and therefore to be in a normal amplifying operation range where a signal of a small amplitude is amplified in a vicinity of its operation point.

Next, the anti-phase input terminals 2 and 4 shown in FIG. 3 are coupled to each other to form a common anti-phase input terminal. Accordingly, the anti-phase input voltages $V_2$ and $v_4$ have a relationship: $v_2=v_4$. Substituting $v_f$ for $v_2$ and $V_4$, equation (7) is expressed as:

$$(v_f-v_1)+(v_f-v_3)=0$$

This equation can be rewritten as:

$$v_f=(v_1+v_3)/2$$

The equation can be interpreted as the input voltage $v_f$ supplied to the common anti-phase input terminal being equal to the mean value of the input voltages supplied to the two in-phase input terminals.

The voltage follower circuit 803 shown in FIG. 2 feeds back the output signal of the differential amplifier circuits 17 and 18 to the common anti-phase input terminal of the differential amplifier circuits 17 and 18. Therefore, the output voltage $V_{out}$ of the voltage follower circuit 803 shown in FIG. 2 is given by equation (8):

$$V_{out}=(v_1+v_3)/2 \qquad (8)$$

The equation can be interpreted as the voltage follower circuit 803 shown in FIG. 2 providing an output voltage having the mean value of the input voltage $V_1$ and the input voltage $V_3$.

Next, the aforementioned relationship is applied to FIG. 2.

Specifically, it is supposed that the input terminal $IN_1$ of the voltage follower circuit 803 shown in FIG. 1 corresponds to the in-phase input terminal 1 shown in FIG. 2, and also that the input terminal $IN_2$ thereof corresponds to the in-phase input terminal 3 shown in FIG. 2. Hence, if the input voltages are equal, when $V_{IN1}=V_0$ and $V_{IN2}=V_0$ for example, $V_{out}=(V_0+V_0)/2=V_0$. More generally, when $V_{IN1}=V_i$ and $V_{IN2}=V_i$, $V_{out}=(V_i+V_i)/2=V_i$, where $i=0, 2, 4, \ldots$, $2(n-1)$. In the present embodiment, n=33.

Meanwhile, if the input voltages differ, when $V_{IN1}=V_0$ and $V_{IN2}=V_2$ for example, $V_{out}=(V_0+V_2)/2$. Accordingly, a voltage having a mean value of $V_0$ and $V_2$ is provided for output. The liquid crystal drive voltage is thus supplemented with a voltage between $V_0$ and $V_2$ which corresponds to $V_1$. The relationship is expressed as $V_{out}=(V_0+V_2)/2=V_1$.

Conversely, the value of $V_2$ can be derived from this equation by substituting desired values for $V_0$ and $V_1$. More generally, when $V_{IN1}=V_i$ and $V_{IN2}=V_{i+2}$, $V_{out}=(v_i+V_{i+2})/2=V_{i+1}$, The standard voltage generating circuit 801, the selector circuit 802, and the voltage follower circuit 803 operate as detailed above. Table 1 shows, as a summary, the outputs of the 6-bit display data and the selector circuit 802 and the input/output relationship provided by the voltage follower circuit 803. In this manner, output voltages for 64 half-tone can be produced from 33 voltage levels $V_0$ to $V_{64}$ similarly to the conventional circuit mentioned in reference to FIG. 12.

Figure 12:
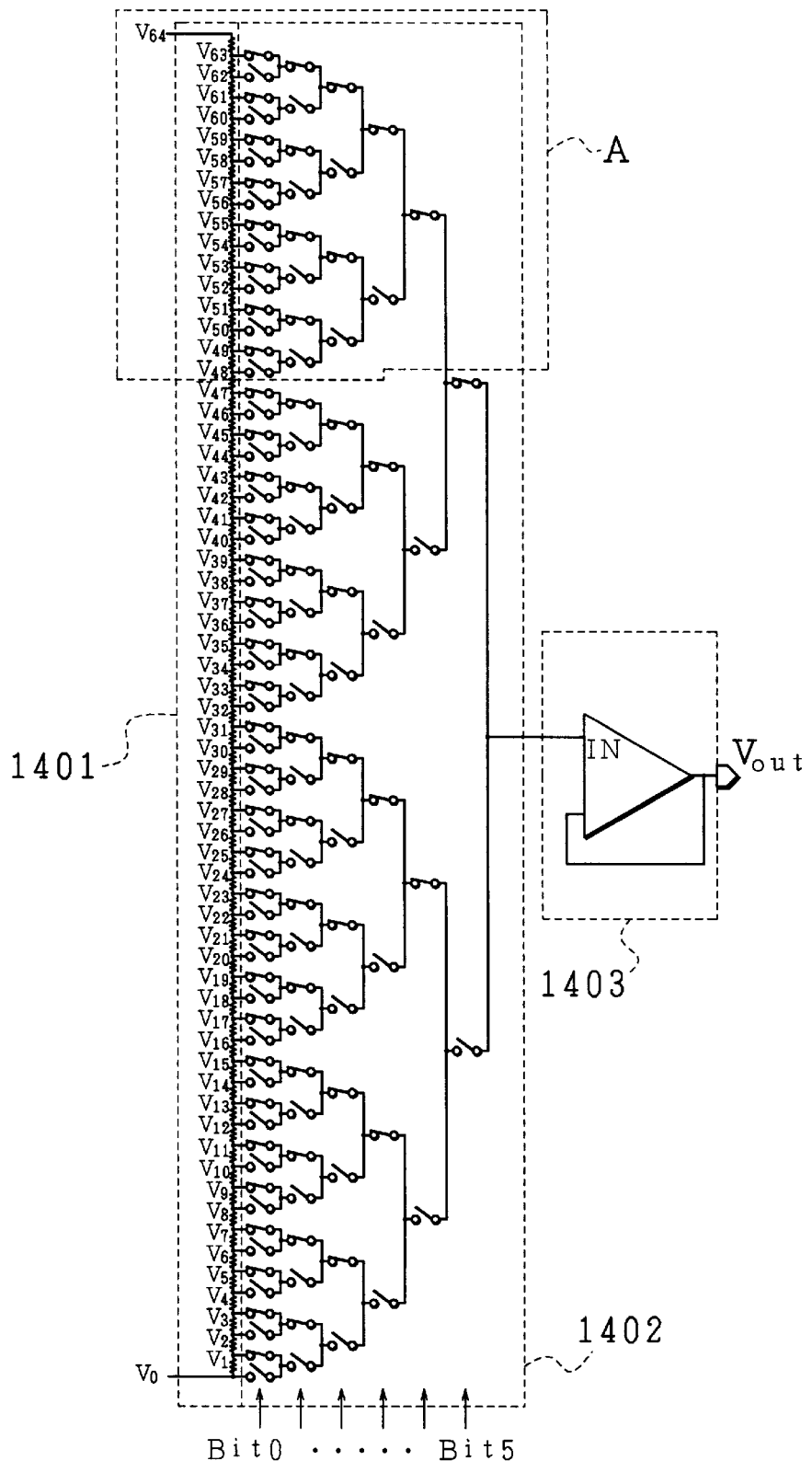
FIG. 12 is a circuit diagram showing an arrangement of a conventional DA converter.
Figure 13:
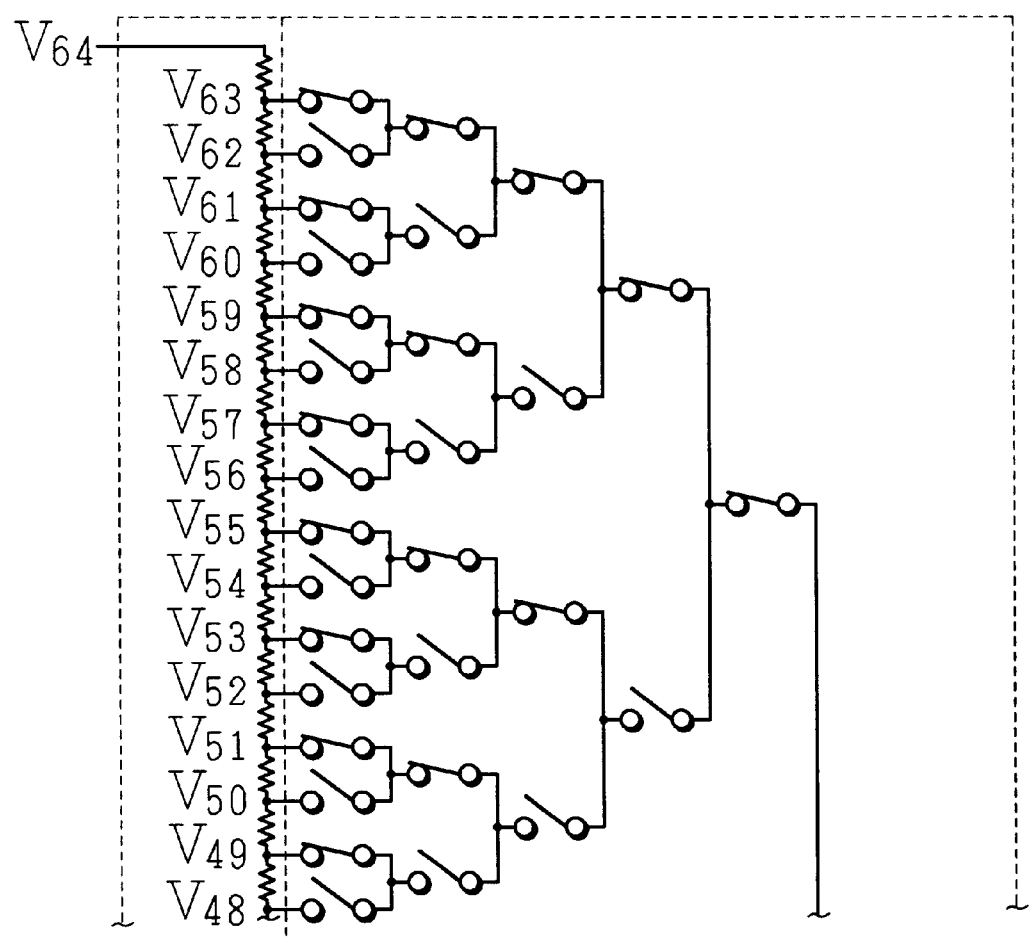
FIG. 13 is a circuit diagram partly showing an arrangement of the DA converter shown in FIG. 12.

Comparing the number of elements constituting the present circuit with the number of elements constituting the conventional circuit shown in FIG. 12, the number of resistors in the standard voltage generating circuit decreased from 64 (=$2^6$) to 32 (=$2^5$), and the number of MOS transistor switches in the selector circuit decreased from 126 to 74. Accordingly, the number of switch pairs is 1+2+3+5+9+17=37, and the number of switches is 2(1+2+3+5+9+17)=74.

Making a comparison along the same line as above for the case of liquid crystal drive voltages obtained from 8-bit display data for a 256 half-tone display, the number of resistors in the standard voltage generating circuit decreases from 256(=$2^8$) to 128(=$2^7$), and the number of MOS transistor switches in the selector circuit decreases from 510 to (1+2+3+5+9+17+33+65)=270.

More generally, supposing that N-bit digital signals are given, the number, P, of switch pairs required in the present invention is given by the following equation:

$$P=a_1+a_2+a_3+\ldots+a_N$$

The number of switches is equal to 2P, where $a_1=1$, $a_2=2$, $a_n=a_{n-1}+2^{(n-3)}$ ($3 \leq n \leq N$).

When (N−1) bit is changed to N bit, the standard voltage generating circuit 801 is removed, and a common terminal is formed for $a_N$ switch pairs SW(N−1) that are similar to those above to fill therein. Then, a new standard voltage generating circuit is disposed, and the lower and upper switches D and U of the switch pairs SW(N−1, n) are coupled respectively to $V_{2(n-1)}$ and $V_k$ of the newly disposed standard voltage generating circuit, where n is an arbitrary integral number from 1 to $a_N$ and $k=2(n-1)+2^{(N-1)}$.

As explained earlier, in accordance with the present invention, normally, a single standard voltage generating circuit 801 is used commonly for a plurality of liquid crystal drive voltage output terminals; however, a selector circuit 802 and a voltage follower circuit 803 are used for each liquid crystal drive voltage output terminal. Further, to display color data (DR, DG, DB) representing colors R(red), G(green), and B(blue), for example, the liquid crystal drive voltage output terminals need to be provided individually for each color according to the color representing display data. Therefore, in the present invention, the size of this particular circuit section, which is relatively large in size among liquid crystal drive circuits, can be reduced in this manner; the present invention contributes greatly to manufacture of smaller chips and lower manufacturing costs resulting by reducing the chip size.

The following description will explain, as examples, arrangements modified from the arrangement shown in FIG. 2. All the circuits operate in exactly the same manner as the circuit shown in FIG. 2; detailed description thereof is therefore omitted.

Figure 4:
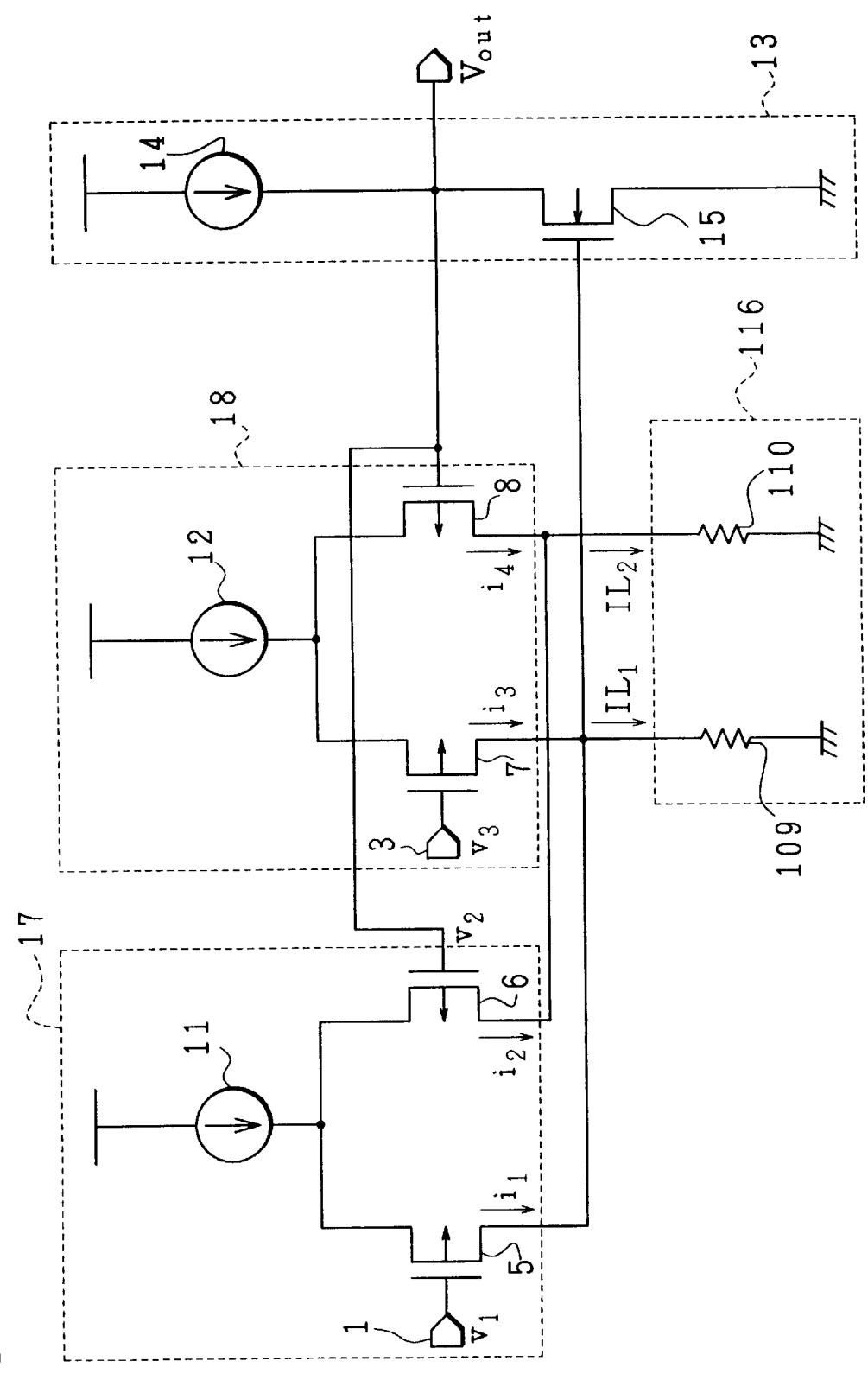
FIG. 4 is a circuit diagram showing, as an example, another voltage follower circuit.

The arrangement shown in FIG. 4 differs from the arrangement shown in FIG. 2 in that the load circuit 16 in FIG. 2 is replaced with a load circuit (load element) 116; resistor elements 109 and 110 are substituted for the N channel MOS transistors 9 and 10 respectively.

Figure 5:
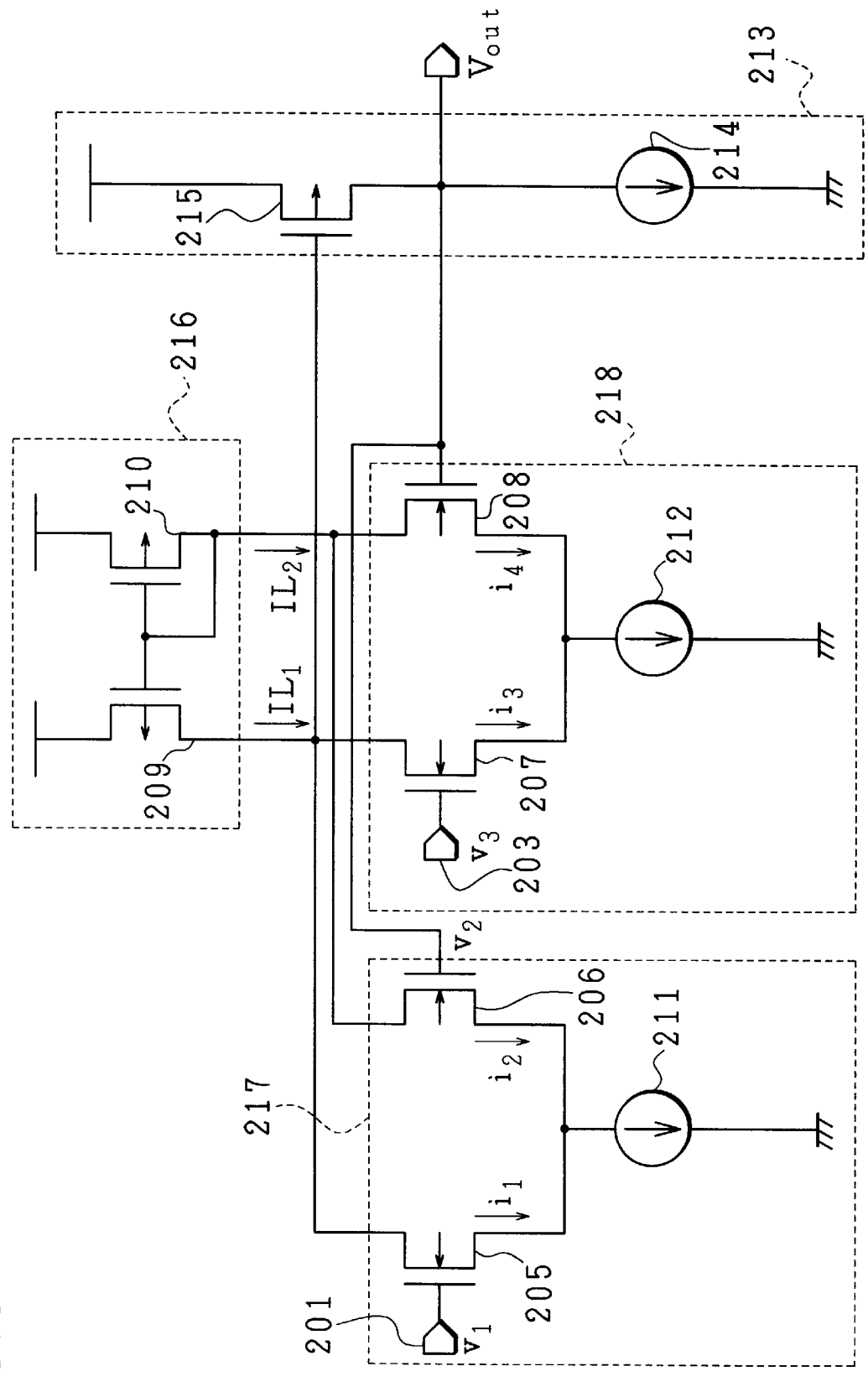
FIG. 5 is a circuit diagram showing, as an example, a further voltage follower circuit.

The arrangement shown in FIG. 5 differs from the arrangement shown in FIG. 2 in that the P channel MOS transistor, constituting a differential pair, is replaced with an N channel MOS transistor, and besides, the N channel MOS transistors in the load circuit and the output section are replaced with a P channel MOS transistor. Specifically, the P channel MOS transistors 5, 6, 7 and 8 are replaced with N channel MOS transistors 205, 206, 207, and 208 respectively, and the N channel MOS transistors 9, 10, and 15 are replaced with P channel MOS transistors 209, 210, 215 respectively. Other elements, i.e., in-phase input terminals 201 and 203 and constant current sources 211, 212, and 214, correspond respectively to the in-phase input terminals 1 and 3 and the constant current sources 11, 12, and 14 in the arrangement shown in FIG. 2.

Figure 6:
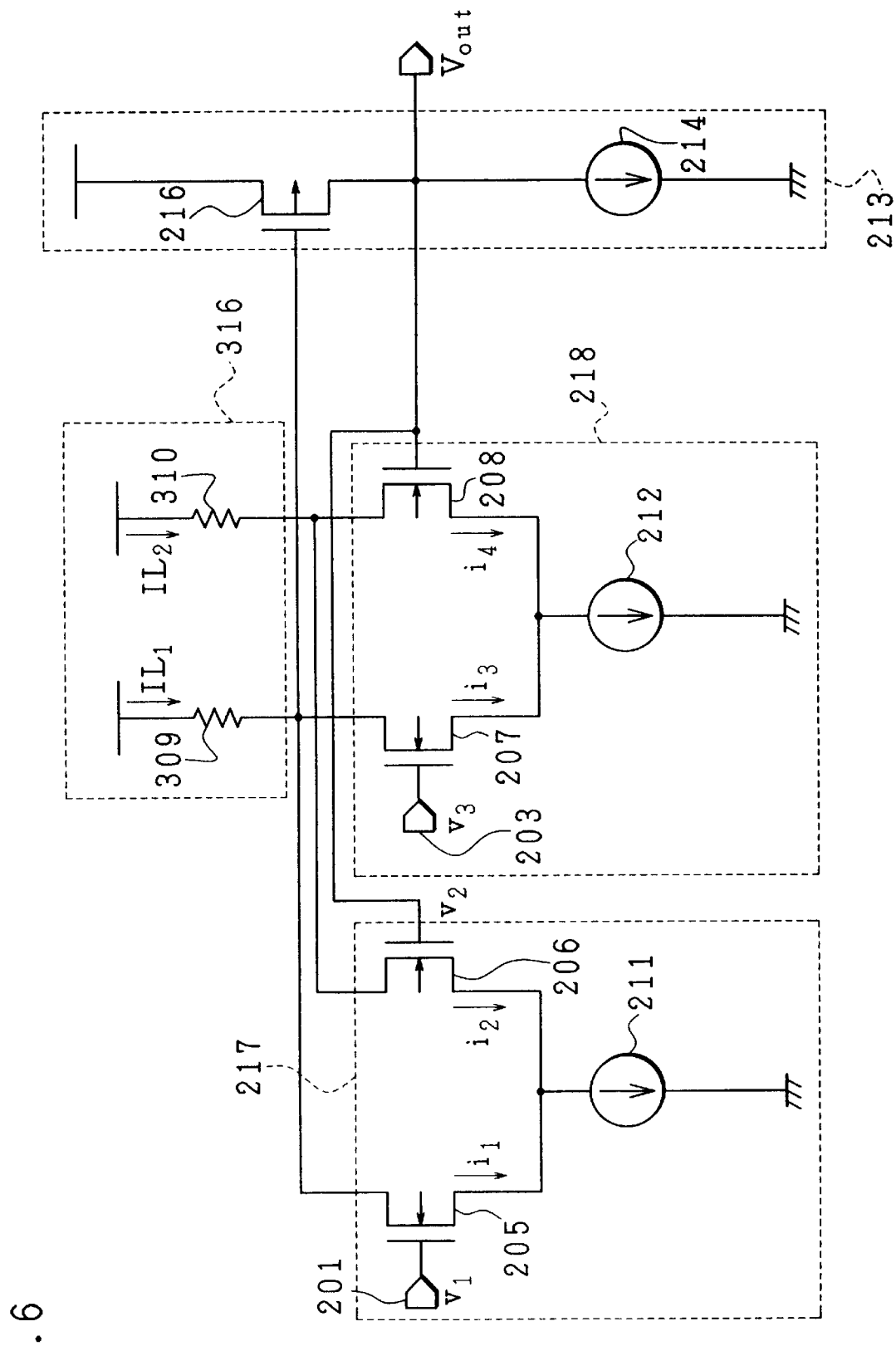
FIG. 6 is a circuit diagram showing, as an example, an even another voltage follower circuit.
Figure 7:
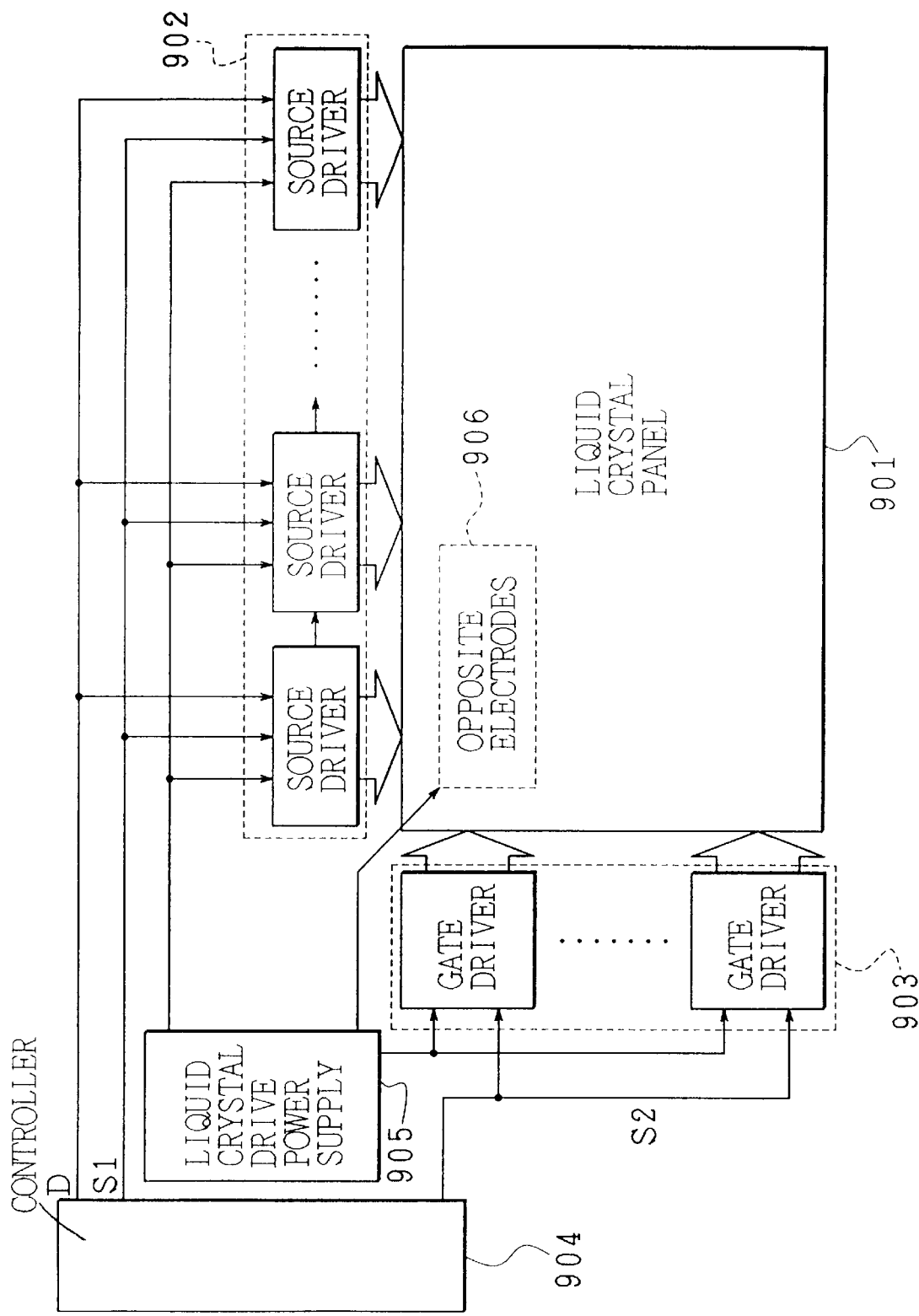
FIG. 7 is a block diagram showing an arrangement of a liquid crystal display device including a DA converter.
Figure 8:
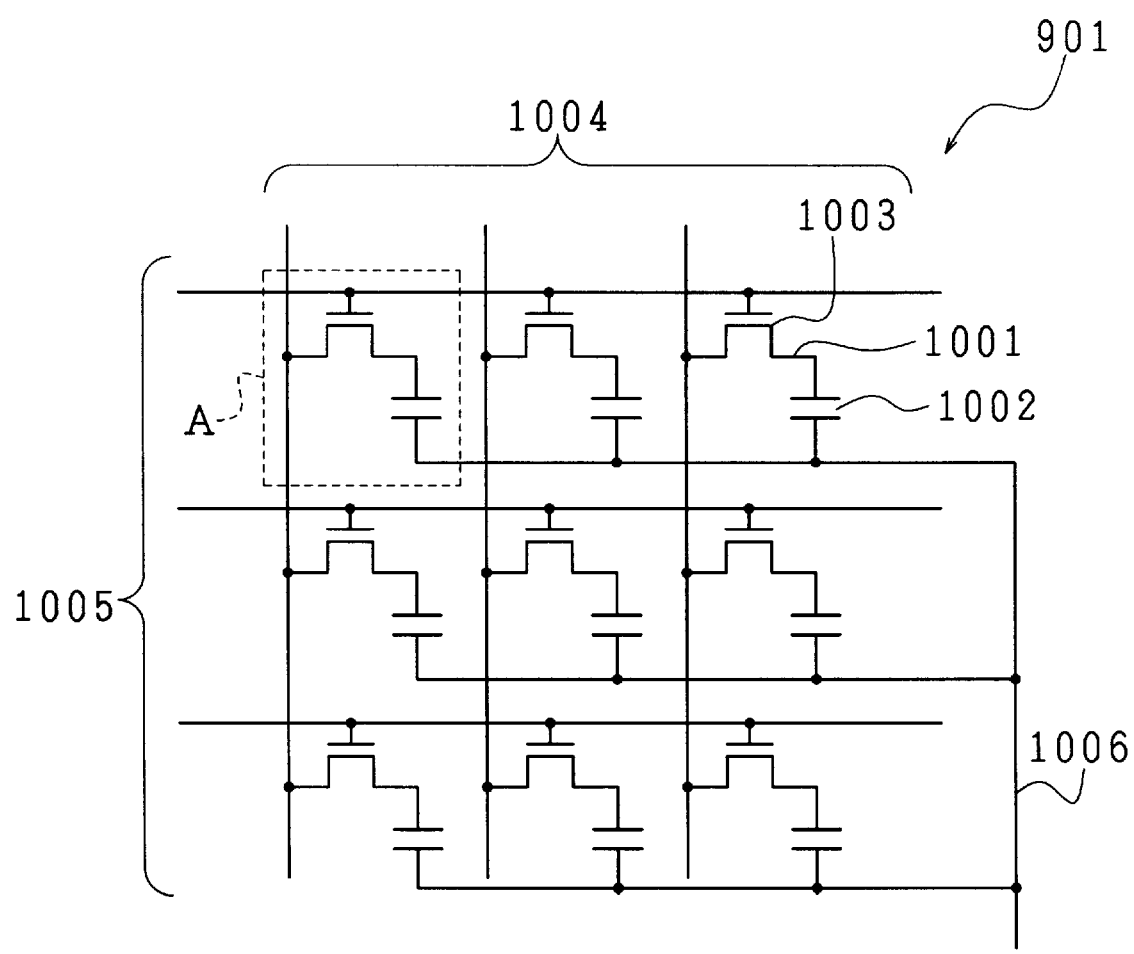
FIG. 8 is a circuit diagram showing an arrangement of a liquid crystal panel of the liquid crystal display device shown in FIG. 7.
Figure 9:
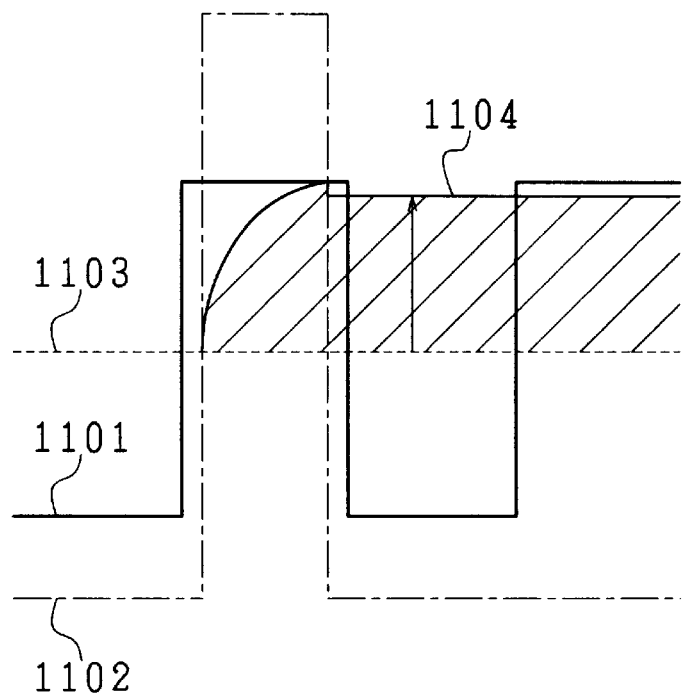
FIG. 9 is an explanatory drawing showing a liquid crystal drive waveform of the liquid crystal display device shown in FIG. 7.
Figure 10:
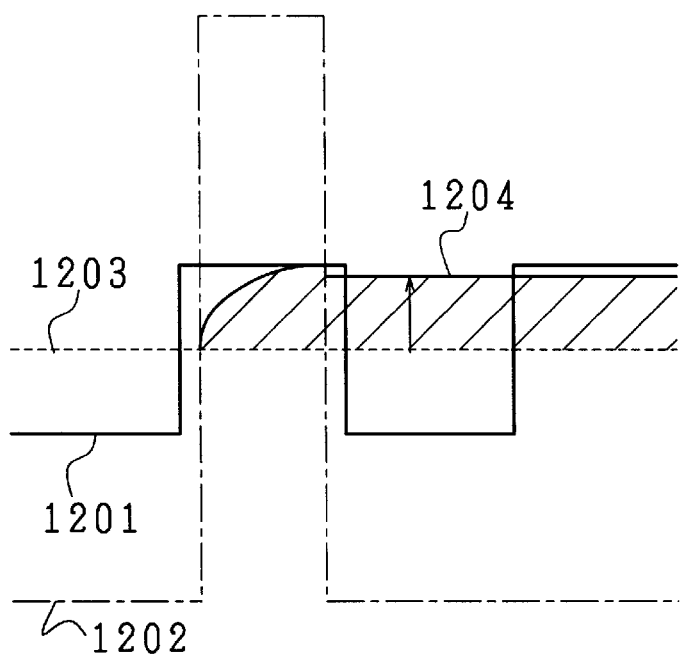
FIG. 10 is an explanatory drawing showing a liquid crystal drive waveform of the liquid crystal display device shown in FIG. 7.
Figure 11:
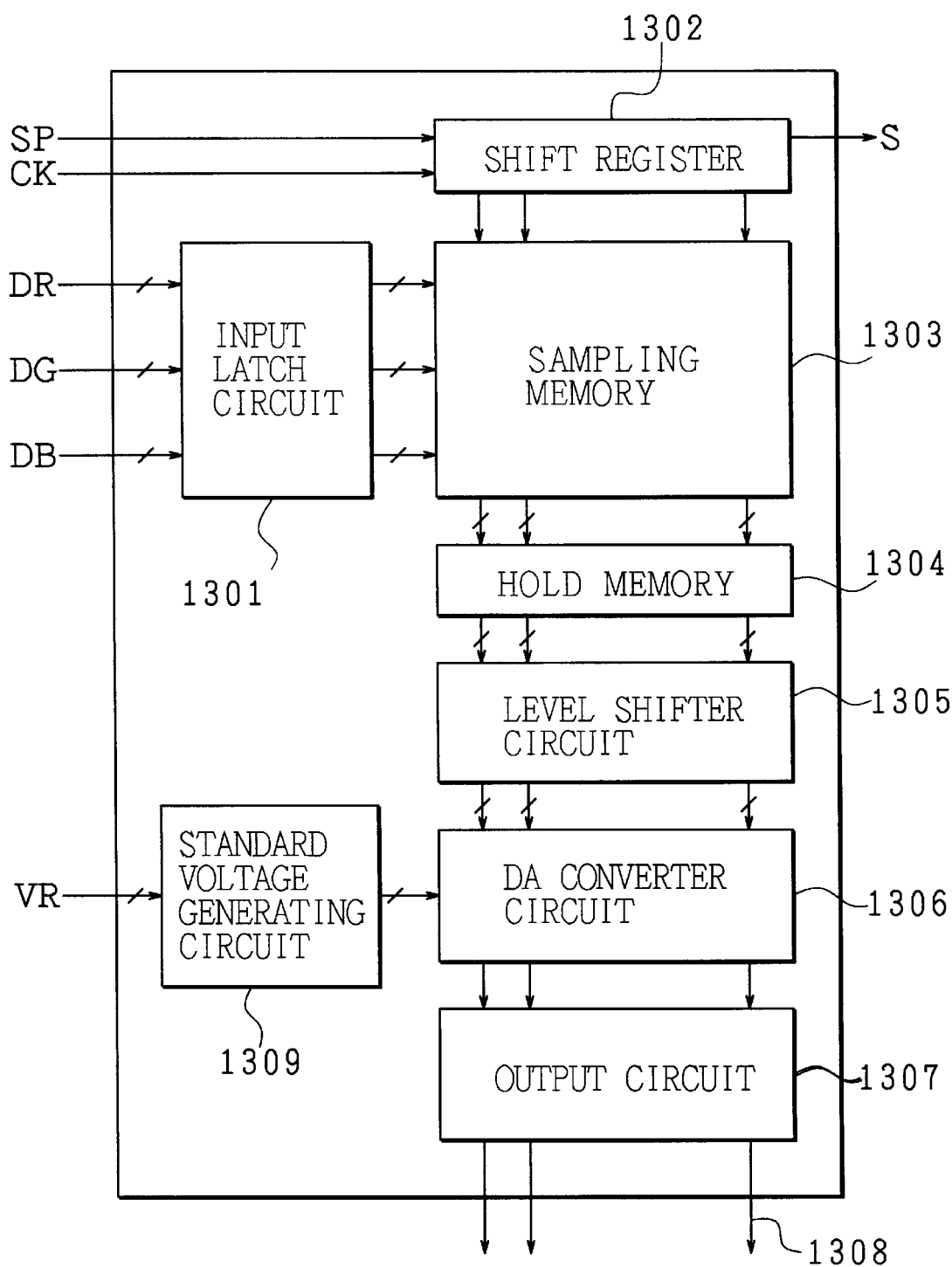
FIG. 11 is a block diagram showing an arrangement of a source driver provided in the liquid crystal display device shown in FIG. 7.

The arrangement shown in FIG. 6 differs from the arrangement shown in FIG. 5 in that the load circuit 216 in FIG. 5 is replaced with a load circuit 316; the P channel MOS transistors 209 and 210 are replaced with resistor elements (load elements) 309 and 310.

The description here, as shown in the above arrangement examples, only refers to cases where two differential pairs, i.e., two differential amplifier circuits, are included; however, an operation similar to that of the above arrangement is possible with a circuit arrangement including three or more amplifier circuits. The arrangement may be fur the r altered in various manners within the scope of the present invention.

For example, if three differential pairs are to be included, in FIG. 2, another differential amplifier circuit similar to the differential amplifier circuit 17 is disposed to the left of the differential amplifier circuit 17, and the sources of P channel MOS transistors (will be referred to as A and B respectively) corresponding to the P channel MOS transistors 5 and 6 are coupled to a power supply via a constant current source corresponding to the constant current source 11. An in-phase input terminal is disposed to the P channel MOG transistor A. The anti-phase input terminal of the P channel MOS transistor B is coupled to the anti-phase input terminal of the P channel MOS transistor 6 in the differential amplifier circuit 17 to form a common input terminal. The drain of the P channel MOS transistor A is, similarly to the drains of the P channel MOS transistors 5 and 7, coupled to the drain of the N channel MOS transistor 9 in the load circuit 16. Meanwhile, the drain of the P channel MOS transistor B is, similarly to the drains of the P channel MOS transistors 6 and 8, coupled to the drain of the N channel MOS transistor 10 in the load circuit 16. Four or more differential pairs can be arranged accordingly.

For example, three differential pairs are to be included, $$V_{out}=(V_{IN1}+V_{IN2}+V_{IN3})/3$$

where $V_{IN1}$, $V_{IN2}$, and $V_{IN3}$ are the respective inputs of the differential pairs (differential amplifier circuits). Note that $V_{IN1}$, $V_{IN2}$, and $V_{IN3}$ are equal to respective standard voltages. Further, if four differential pairs are to be included, $$V_{out}=(V_{IN1}+V_{IN2}+V_{IN3}+V_{IN4})/4$$

where $V_{IN1}$, $V_{IN2}$, $V_{IN3}$, and $V_{IN4}$ are the respective inputs of the differential pairs (differential amplifier circuits). Note that $V_{IN1}$, $V_{IN2}$, $V_{IN3}$, and $V_{IN4}$ are equal to respective standard voltages. Five or more differential pairs can be arranged accordingly.

An example is taken where four differential pairs are provided and the interval between the two standard voltages $V_i$ and $V_j$ is divided equally into four parts using the equations below. Specifically, either of the standard voltages $V_i$ or $V_j$ is coupled to the inputs $V_{IN1}$, $V_{IN2}$, $V_{IN3}$, and $V_{IN4}$ of the respective differential pairs as follows. It is supposed that i and j differ from each other.

(1) When $V_i$ is coupled to all the inputs, $$V_{out}=(V_i+V_i+V_i+V_i)/4=V_i$$

(2) When $V_i$ is coupled to $V_{IN1}$, $V_{IN2}$, and $V_{IN3}$, and $V_j$ is coupled to $V_{IN4}$, $$V_{out}=(V_i+V_i+V_i+V_j)/4=(3/4)V_i+(1/4)V_j$$

(3) When $V_i$ is coupled to $V_{IN1}$, and $V_{IN2}$, and $V_j$ is coupled to $V_{IN3}$ and $V_{IN4}$, $$V_{out}=(V_i+V_i+V_j+V_j)/4=(2/4)V_i+(2/4)V_j$$

(4) When $V_i$ is coupled to $V_{IN1}$, and $V_j$ is coupled to $V_{IN2}$, $V_{IN3}$, and $V_{IN4}$, $$V_{out}=(V_i+V_j+V_j+V_j)/4=(1/4)V_i+(3/4)V_j$$

With these arrangements, the DA converter becomes suitable for use with a liquid crystal drive circuit, for example.

Further, provided that all the output voltages obtained are different from each other and also that there are no problems at all regarding conditions of the various devices for which the DA converter is used, in the arrangement shown in FIG. 1, for example, the wiring connected to the positions of the standard voltage V48 and the standard voltage V50 may be reversed: the wiring connected to the position of V48 may be connected to the position of V50, while the wiring connected to the position of V50 is connected to the position of V48. More generally, wiring may be changed so that Cn is connected to the position of Vm and Cm is connected to the position of Vn, where Cm and Cn denote the wiring connected to the positions of the standard voltages Vm and Vn. Note that when there are N bits, $$m=0, 2, 4, \ldots, 2(N-1)$$

$$n=0, 2, 4, \ldots, 2(N-1)$$

$$m \neq n$$

In the present embodiment, $$N=33$$

Moreover, liquid crystal drive circuits were taken as examples for explanation here; this however is not intended to limit the scope of the present invention: Other examples include those DA converters converting N-bit digital signals to $2^N$ analogue levels (signals), based on $2^{(N-1)}+1$ analogue signals and providing supplementary levels of values between the $2^{(N-1)}+1$ analogue signals, and those display devices and semiconductor devices arranged so as to include such DA converters.

Note that the DA converter of the present invention may be arranged as follows. The DA converter converting N-bit digital signals to $2^N$ analogue signals may include:

standard voltage generating means for generating $2^{(N-1)}+1$ standard voltages;

selector means for providing outputs of predetermined first and second values from the $2^{(N-1)}+1$ standard voltages according to a digital signal, the first and second values possibly being equal to each other; and output means for when the first and second values are equal, providing an output of the equal value, and when the first and second values are not equal, providing an output of a mean value of the first and second values.

In such an arrangement, as the standard voltage generating means generates $2^{(N-1)}+1$ different standard voltages, the selector means turns on/off switches according to a digital signal, for example, to select first and second values from the standard voltages. The selected first and second values may be equal. If the first value and the second value are equal, the output means provides an output voltage having that value; if the first value and the second value are different, the output means provides an output voltage having the mean value of those values.

Further, in the DA converter, as explained earlier as an example, the standard voltage generating means may be a resistance type potential divider circuit where a plurality of resistor elements are coupled to each other to generate a plurality of voltages at connecting portions between the resistor elements.

Also, in the DA converter, as explained earlier as an example, the output means may be arranged as follows. Two differential pairs are arranged from first conductive type MOS transistors, so that one of the terminals of each differential pair is coupled to a power supply via first and second constant current sources and the other terminal is grounded via a current mirror circuit where the in-phase input terminal sides are coupled to each other, and the anti-phase input terminal sides are also coupled to each other. The in-phase input terminal sides are also coupled to the gate of second conductive type MOS transistor. One of the terminals of each second conductive type MOS transistor is coupled to a power supply via a third constant current source and also to a common line formed by coupling of the anti-phase input terminal sides. The other terminal of each second conductive type MOS transistor is grounded, and the two in-phase input terminals are coupled to the respective output terminals of the selector means.

Further, in the DA converter, as explained earlier as an example, the output means may be arranged as follows. Two differential pairs are arranged from second conductive type MOS transistors, so that one of the terminals of each differential pair is grounded via first and second constant current sources and the other terminal is coupled to a power supply via a current mirror circuit where the in-phase input terminal sides are coupled to each other, and the anti-phase input terminal sides are also coupled to each other. The in-phase input terminal sides are further coupled to the gates of first conductive type MOS transistors, and one of the terminals of each first conductive type MOS transistor is coupled to a grounded third constant current source and also to a common line formed by coupling of the anti-phase input terminal sides. The other terminal of each first conductive type MOS transistor is coupled to a power supply. The two in-phase input terminals are coupled to the respective output terminals of the selector means.

Further, in the DA converter, as explained earlier as an example, the current mirror circuit in output means may be replaced with two resistor elements.

Further, as explained earlier as an example, a part of a drive circuit (liquid crystal drive circuit) of a liquid crystal display device may be arranged to include the DA converter.

In such an arrangement, by simultaneously providing a plurality of different voltages to a plurality of in-phase input terminals, the mean value of these signals can be provided as an output voltage at an output terminal. The output voltage differs from any of the voltages externally provided to the output means. Meanwhile, by simultaneously providing the same voltage to a plurality of in-phase input terminals, the voltage having the same value with the input voltage can be provided as an output voltage at an output terminal.

Therefore, in a liquid crystal drive circuit incorporating such a DA converter circuit, voltages produced by supplementation are available for output as well as voltages produced by the standard voltage generating circuit. Consequently, the standard voltage generating circuit only needs to produce a much smaller number of voltages than the required number of half-tone output voltages: for example, substantially half the required number.

Hence, the number of resistor elements constituting the standard voltage generating circuit can be reduced greatly, for example, almost halved. Further, since the number of voltages provided by the standard voltage generating circuit is reduced, the number of switches of a selector circuit for selecting some of these voltages can be also reduced greatly in comparison with conventional technology. Since a selector circuit is provided to each liquid crystal drive voltage output terminal, the reduction in the number of circuits permits a great reduction in manufacturing cost. Further, the reduction in the number of circuits enables the IC and other elements used in a liquid crystal drive circuit to be reduced in chip size greatly. The smaller IC for use in a liquid crystal drive circuit allows a liquid crystal display device incorporating the IC to be greatly reduced in size. In this manner, the present invention is particularly effective in coming commercialization of high quality display devices with higher resolution and better half-tone display capabilities using increasingly large numbers of pixels as well as more compact display devices with enhanced portability.

In the DA converter in accordance with the present invention, the standard voltage generating means may be a resistance type potential divider circuit arranged from a plurality of resistor elements coupled to each other to provide the standard voltages at connecting portions between the resistor elements, while the selector means may be arranged to store $2^{(N-1)}$ pairs each composed of two identical standard voltages, and $2^{(N-1)}$ pairs composed of standard voltages derived at ends of the resistor elements.

With the arrangement, the standard voltage generating means includes a resistance type potential divider circuit arranged from a plurality of resistor elements coupled to each other to provide the standard voltages at connecting portions between the resistor elements, while the selector means stores $2^{(N-1)}$ pairs each composed of two identical standard voltages and $2^{(N-1)}$ pairs composed of standard voltages derived at ends of the resistor elements. For example, if the pairs do not have the same value, the selector means selects, from the aforementioned standard voltages, the standard voltages at the ends of a resistor element according to the digital signal. Therefore, no matter what kind of standard voltages are produced by the standard voltage generating means through division by means of the resistor elements, there is no likelihood of the mean value being equal to a mean value of another pair. This allows more freedom in specification of the resistance values of the resistor elements, which in turn allows more freedom in specification of the standard voltage and simpler arrangement of the standard voltage generating means.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A digital-to-analogue converter for converting N-bit digital signals to analogue signals by generating mutually different standard voltages and providing $2^N$ output voltages based on the standard voltages according to the digital signals, said digital-to-analogue converter comprising:

standard voltage generating means for generating $2^{(N-1)}+1$ mutually different standard voltages, selector means for: storing standard voltage pairs in advance so that none of the standard voltage pairs produces an identical mean value and also so that each of the digital signals corresponds to one of the standard voltage pairs; upon reception of one of the digital signals, selecting one of the standard voltage pairs corresponding to the received digital signal; and providing the standard voltages constituting the selected standard voltage pair for output; and output means for receiving the output standard voltages of the selector means, and providing as the output voltage a mean value of the received standard voltages, wherein the selector means includes switch pairs, each including two switches, for selecting one of two input signals according to data expressed in each bit of the N-bit digital signals, and wherein $a_1=1$, $a_2=2$, $a_n=a_{n-1}+2^{(n-3)}$ ($3<n<N$) where $a_n$ is the number of switch pairs of the selector means for the n-th lowest digit bit.

2. A digital-to-analogue converter for converting N-bit digital signals to analogue signals by generating mutually different standard voltages and providing $2^N$ output voltages based on the standard voltages according to the digital signals, said digital-to-analogue converter comprising standard voltage generating means for generating $2^{(N-1)}+1$ mutually different standard voltages, selector means for: storing standard voltage pairs in advance so that none of the standard voltage pairs produces an identical mean value and also so that each of the digital signals corresponds to one of the standard voltage pairs; upon reception of one of the digital signals, selecting one of the standard voltage pairs corresponding to the received digital signal; and providing the standard voltages constituting the selected standard voltage pair for output; and output means for receiving the output standard voltages of the selector means, and providing as the output voltage a mean value of the received standard voltages, wherein the selector means includes switch pairs, each including two switches, for selecting one of two input signals according to data expressed in each bit of the N-bit digital signals, and wherein $a_1=1$, $a_2=2$, $a_n=1+2^{(n-2)}$ ($3\leq n\leq N$) where $a_n$ is the number of switch pairs of the selector means for the n-th lowest digit bit.

3. A digital-to-analogue converter for converting N-bit digital signals to analogue signals by generating mutually different standard voltages and providing $2^N$ output voltages based on the standard voltages according to the digital signals, said digital-to-analogue converter comprising:

standard voltage generating means for generating $2^{(N-1)}+1$ mutually different standard voltages, selector means for: storing standard voltage pairs in advance so that none of the standard voltage pairs produces an identical mean value and also so that each of the digital signals corresponds to one of the standard voltage pairs; upon reception of one of the digital signals, selecting one of the standard voltage pairs corresponding to the received digital signal; and providing the standard voltages constituting the selected standard voltage pair for output; and output means for receiving the output standard voltages of the selector means, and providing as the output voltage a mean value of the received standard voltages, wherein the selector means includes switch pairs, each including two switches, for selecting one of two input signals according to data expressed in each bit of the N-bit digital signals, and wherein $a_1=1$, $a_2=2$, $a_n=2a_{n-1}-1$ ($3\leq n\leq N$) where $a_n$ is the number of switch pairs of the selector means for the n-th lowest digit bit.

4. A digital-to-analogue converter for converting N-bit digital signals to analogue signals by generating mutually different standard voltages and providing $2^N$ output voltages based on the standard voltages according to the digital signals, said digital-to-analogue converter comprising:

standard voltage generating means for generating $2^{(N-1)}+1$ mutually different standard voltages, selector means for: storing standard voltage pairs in advance so that none of the standard voltage pairs produces an identical mean value and also so that each of the digital signals corresponds to one of the standard voltage pairs; upon reception of one of the digital signals, selecting one of the standard voltage pairs corresponding to the received digital signal; and providing the standard voltages constituting the selected standard voltage pair for output; and output means for receiving the output standard voltages of the selector means, and providing as the output voltage a mean value of the received standard voltages, wherein the selector means includes switch pairs, each including two switches, for selecting one of two input signals according to data expressed in each bit of the N-bit digital signals, and wherein one of the two switches of the switch pairs of the selector means is a switch D conducting when a bit is 0, the other is a switch U conducting when a bit is 1, and an end of the switch D and an end of the switch U are coupled to each other to form a common terminal, wherein terminals d of the switches D of switch pairs SW(n−1) located opposite to the common terminals are coupled to respective common terminals of $a_n$ switch pairs out of switch pairs SW(n), terminals u of the switches U of the switch pairs SW(n−1) located opposite to the common terminals are coupled to respective common terminals of $a_n$ switch pairs out of the switch pairs SW(n), and the terminals d and u are coupled to a common terminal of one of the switch pairs SW(n), where n is any given integral number equaling or larger than 2, $a_n$ is the number of switch pairs for the n-th lowest bit, and SW(n−1) collectively refers to the switch pairs for the n-th lowest bit.

5. A digital-to-analogue converter as set forth in claims 1, 2, 3, or 4, wherein the standard voltage generating means is a resistance type-potential divider circuit arranged from a plurality of resistor elements coupled to each other to provide the standard voltages at connecting portions between the resistor elements, and the selector means stores $2^{(N-1)}$ pairs, each including two identical standard voltages and $2^{(N-1)}$ pairs, each including standard voltages derived at ends of the resistor elements.

6. A digital-to-analogue converter as set forth in claims 1, 2, 3, or 4, wherein the standard voltage generating means generates, as the standard voltages, voltages corresponding to every other one of the output voltages of the output means when listed in increasing order of magnitude.

7. A digital-to-analogue converter as set forth in claims 1, 2, 3, or 4, wherein the output means includes an output section and a plurality of differential amplifier circuits, each of the plurality of differential amplifier circuits includes an in-phase input terminal and an anti-phase input terminal to receive an input of the standard voltage provided by the selector means, and also includes a differential pair having a first conductive type MOS transistor disposed on the same side as the in-phase input terminal and a first conductive type MOS transistor disposed on the same side as the anti-phase input terminal, the MOS transistor of the differential pair has a source coupled to a power supply via a constant current source, the MOS transistor disposed on the same side as the in-phase input terminal has a drain grounded via a first load element and a gate coupled to the in-phase input terminal, and the MOS transistor disposed on the same side as the anti-phase input terminal has a drain grounded via a second load element and a gate coupled to one of the anti-phase input terminal, the output section includes a second conductive type MOS transistor having a gate coupled to the drain of the MOS transistor disposed on the same side as the in-phase input terminal, a source grounded, and a drain coupled to a power supply via a constant current source as well as to a gate of the MOS transistor disposed on the same side as the anti-phase input terminal and an output terminal.

8. A digital-to-analogue converter as set forth in claim 7, wherein the first conductive type MOS transistor is a P channel MOS transistor, and the second conductive type MOS transistor is an N channel MOS transistor.

9. A digital-to-analogue converter as set forth in claim 7, wherein the first and second load elements each include an MOS transistor.

10. A digital-to-analogue converter as set forth in claim 9, wherein the first and second load elements are part of a current mirror circuit.

11. A digital-to-analogue converter as set forth in claim 7, wherein the first and second load elements each include a resistor element.

12. A digital-to-analogue converter as set forth in claim 7, wherein the digital-to-analogue converter includes two sets of differential pairs.

13. A digital-to-analogue converter as set forth in claims 1, 2, 3, or 4, wherein the output means includes an output section and a plurality of differential amplifier circuits, each of the plurality of differential amplifier circuits includes an in-phase input terminal and an anti-phase input terminal to receive an input of the standard voltage provided by the selector means, and also includes a differential pair having a second conductive type MOS transistor disposed on the same side as the in-phase input terminal and a second conductive type MOS transistor disposed on the same side as the anti-phase input terminal, the MOS transistor of the differential pair has a source grounded via a constant current source, the MOS transistor disposed on the same side as the in-phase input terminal has a drain coupled to a power supply via a first load element and a gate coupled to the in-phase input terminal, and the MOS transistor disposed on the same side as the anti-phase input terminal has a drain coupled to a power supply via a second load element and a gate coupled to the anti-phase input terminal, the output section includes a first conductive type MOS transistor having a gate coupled to the drain of the MOS transistor disposed on the same side as the in-phase input terminal, a source coupled to a power supply, and a drain grounded via a constant current source as well as to a gate of the MOS transistor disposed on the same side as the anti-phase input terminal and an output terminal.

14. A digital-to-analogue converter as set forth in claim 13, wherein the first conductive type MOS transistor is a P channel MOS transistor, and the second conductive type MOS transistor is an N channel MOS transistor.

15. A digital-to-analogue converter as set forth in claim 13, wherein the first and second load elements each include an MOS transistor.

16. A digital-to-analog converter as set forth in claim 15, wherein the first and second load elements are part of a current mirror circuit.

17. A digital-to-analog converter as set forth in claim 13, wherein the first and second load elements each include a resistor element.

18. A digital-to-analog converter as set forth in claim 13, wherein the digital-to-analog converter includes two sets of differential pairs.

19. A liquid crystal driving device for converting display data from digital to analogue for output via a liquid crystal driving voltage output terminal to apply the DA converted data to a liquid crystal display element, said liquid crystal driving device including a digital-to-analogue converter for converting display data by converting N-bit digital signals to analogue signals through generation of mutually different standard voltages and provision of $2^N$ output voltages based on the standard voltages according to the digital signal, said digital-to-analogue converter comprising:

standard voltage generating means for generating $2^{(N-1)}+1$ mutually different standard voltages, selector means for: storing standard voltage pairs in advance so that none of the standard voltage pairs produces an identical mean value and also that each of the digital signals corresponds to one of the standard voltage pairs; upon reception of one of the digital signals, selecting one of the standard voltage pairs corresponding to the received digital signal; and providing the standard voltages constituting the selected standard voltage pair for output, and output means for receiving the output standard voltages of the selector means, and providing as the output voltage a mean value of the received standard voltages, wherein the selector means includes switch pairs, each including two switches, for selecting one of two input signals according to data expressed in each bit of the N-bit digital signals, and $a_1=1$, $a_2=2$, $a_n=a_{n-1}+2^{(n-3)}$ ($3 \leq n \leq N$) where $a_n$ is the number of switch pairs of the selector means for the n-th lowest digit bit.

20. A liquid crystal driving device for converting display data from digital to analogue for output via a liquid crystal driving voltage output terminal to apply the DA converted data to a liquid crystal display element, said liquid crystal driving device including a digital-to-analogue converter for converting display data by converting N-bit digital signals to analogue signals through generation of mutually different standard voltages and provision of $2^N$ output voltages based on the standard voltages according to the digital signal, said digital-to-analogue converter comprising:

standard voltage generating means for generating $2^{(N-1)}+1$ mutually different standard voltages, selector means for: storing standard voltage pairs in advance so that none of the standard voltage pairs produces an identical mean value and also that each of the digital signals corresponds to one of the standard voltage pairs; upon reception of one of the digital signals, selecting one of the standard voltage pairs corresponding to the received digital signal; and providing the standard voltages constituting the selected standard voltage pair for output, and output means for receiving the output standard voltages of the selector means, and providing as the output voltage a mean value of the received standard voltages, wherein the selector means includes switch pairs, each including two switches, for selecting one of two input signals according to data expressed in each bit of the N-bit digital signals, and wherein $a_1=1$, $a_2=2$, $a_n=1+2^{(n-2)}$ ($3 \leq n \leq N$) where $a_n$ is the number of switch pairs of the selector means for the n-th lowest digit bit.

21. A liquid crystal driving device for converting display data from digital to analogue for output via a liquid crystal driving voltage output terminal to apply the DA converted data to a liquid crystal display element, said liquid crystal driving device including a digital-to-analogue converter for converting display data by converting N-bit digital signals to analogue signals through generation of mutually different standard voltages and provision of $2^N$ output voltages based on the standard voltages according to the digital signal, said digital-to-analogue converter comprising:

standard voltage generating means for generating $2^{(N-1)}+1$ mutually different standard voltages, selector means for: storing standard voltage pairs in advance so that none of the standard voltage pairs produces an identical mean value and also that each of the digital signals corresponds to one of the standard voltage pairs; upon reception of one of the digital signals, selecting one of the standard voltage pairs corresponding to the received digital signal; and providing the standard voltages constituting the selected standard voltage pair for output, and output means for receiving the output standard voltages of the selector means, and providing as the output voltage a mean value of the received standard voltages, wherein the selector means includes switch pairs, each including two switches, for selecting one of two input signals according to data expressed in each bit of the N-bit digital signals, and wherein $a_1=1$, $a_2=2$, $a_n=2a_{n-1}-1$ ($3 \leq n \leq N$) where $a_n$ is the number of switch pairs of the selector means for the n-th lowest digit bit.

22. A liquid crystal driving device for converting display data from digital to analogue for output via a liquid crystal driving voltage output terminal to apply the DA converted data to a liquid crystal display element, said liquid crystal driving device including a digital-to-analogue converter for converting display data by converting N-bit digital signals to analogue signals through generation of mutually different standard voltages and provision of $2^N$ output voltages based on the standard voltages according to the digital signal, said digital-to-analogue converter comprising:

standard voltage generating means for generating $2^{(N-1)}+1$ mutually different standard voltages, selector means for: storing standard voltage pairs in advance so that none of the standard voltage pairs produces an identical mean value and also that each of the digital signals corresponds to one of the standard voltage pairs; upon reception of one of the digital signals, selecting one of the standard voltage pairs corresponding to the received digital signal; and providing the standard voltages constituting the selected standard voltage pair for output, and output means for receiving the output standard voltages of the selector means, and providing as the output voltage a mean value of the received standard voltages, wherein the selector means includes switch pairs, each including two switches, for selecting one of two input signals according to data expressed in each bit of the N-bit digital signals, and wherein one of the two switches of the switch pairs of the selector means is a switch D conducting when a bit is 0, the other is a switch U conducting when a bit is 1, and an end of the switch D and an end of the switch U are coupled to each other to form a common terminal, wherein terminals d of the switches D of switch pairs SW(n−1) located opposite to the common terminals are coupled to respective common terminals of $a_n$ switch pairs out of switch pairs SW(n), terminals u of the switches U of the switch pairs SW(n−1) located opposite to the common terminals are coupled to respective common terminals of $a_n$ switch pairs out of the switch pairs SW(n), and the terminals d and u are coupled to a common terminal of one of the switch pairs SW(n), where n is any given integral number equaling or larger than 2, $a_n$ is the number of switch pairs for the n-th lowest bit, and SW(n−1) collectively refers to the switch pairs for the n-th lowest bit.

23. A digital-to-analog converter as set forth in claims 19, 20 21, or 22, wherein the standard voltages correspond to liquid crystal driving voltages representing every other half-tone levels.

* * * * *

UNITED STATES PATENT AND TRADEMARK OFFICE
CERTIFICATE OF CORRECTION

PATENT NO. : 6,373,419 B1
DATED : April 16, 2002
INVENTOR(S) : Tomoaki Nakao

It is certified that error appears in the above-identified patent and that said Letters Patent is hereby corrected as shown below:

<u>Title page,</u>
Item [56], References Cited, U.S. PATENT DOCUMENTS, please insert a section entitled "OTHER PUBLICATIONS" as follows:

--                          OTHER PUBLICATIONS
CMOS Device Handbook, pages 584-587, edited by the Editing Committee for CMOS Device Handbook and published by The Nikkan Kogyo Shimbun Ltd. on September 29, 1987. --

Signed and Sealed this

Third Day of December, 2002

JAMES E. ROGAN
*Director of the United States Patent and Trademark Office*